(12) United States Patent
Okita et al.

(10) Patent No.: US 8,883,025 B2
(45) Date of Patent: Nov. 11, 2014

(54) PLASMA PROCESSING APPARATUS AND PLASMA PROCESSING METHOD

(75) Inventors: Shogo Okita, Hyogo (JP); Yasuhiro Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 53 days.

(21) Appl. No.: 13/701,170

(22) PCT Filed: May 25, 2011

(86) PCT No.: PCT/JP2011/002909
§ 371 (c)(1),
(2), (4) Date: Nov. 30, 2012

(87) PCT Pub. No.: WO2011/151996
PCT Pub. Date: Dec. 8, 2011

(65) Prior Publication Data
US 2013/0068727 A1    Mar. 21, 2013

(30) Foreign Application Priority Data

Jun. 1, 2010  (JP) ................................. 2010-125592
Jun. 1, 2010  (JP) ................................. 2010-125593

(51) Int. Cl.
*H01L 21/66* (2006.01)
*H01L 21/68* (2006.01)
(Continued)

(52) U.S. Cl.
CPC ............ *B44C 1/227* (2013.01); *H01L 21/6831* (2013.01); *H01L 21/681* (2013.01); *H01L 21/67109* (2013.01); *H01L 21/68742* (2013.01); *H01L 21/68771* (2013.01); *H01L 21/67742* (2013.01); *H05H 2001/4675* (2013.01); *H01L 21/68764* (2013.01); *H01J 37/32779* (2013.01); *H01L 21/68707* (2013.01); *H01L 21/67754* (2013.01); *Y10S 438/973* (2013.01)
USPC ................... 216/60; 216/67; 438/9; 438/710; 438/973; 427/8; 427/569

(58) Field of Classification Search
None
See application file for complete search history.

(56) References Cited

U.S. PATENT DOCUMENTS 6,197,117 B1 * 3/2001 Li et al. .......................... 118/715
6,274,878 B1 * 8/2001 Li et al. .......................... 250/548
(Continued)

FOREIGN PATENT DOCUMENTS

JP        3-276092      12/1991
JP       2002-321131   11/2002
(Continued)

OTHER PUBLICATIONS

English translation of the International Preliminary Report on Patentability issued Jan. 8, 2013 in International (PCT) Application No. PCT/JP2011/002909.

(Continued)

*Primary Examiner* — Anita Alanko
(74) *Attorney, Agent, or Firm* — Wenderoth, Lind & Ponack, L.L.P.

(57) ABSTRACT

A plasma processing apparatus includes a stock unit, a processing unit, and an alignment chamber. The stock unit supplies and collects a conveyable tray formed with a plurality of housing holes in each of which a wafer is housed. In the processing chamber, plasma processing is executed on the wafers housed in the tray supplied from the stock unit. The alignment chamber is provided with a rotating table on which the tray before being subjected to the plasma processing is set to perform positioning of the wafers on the rotating table. A housing state determination unit of a control device determines whether or not the wafer is misaligned with respect the housing hole of the tray based on a height detected by height detecting sensors.

4 Claims, 26 Drawing Sheets

(51) Int. Cl.
*H01L 21/683* (2006.01)
*H01L 21/67* (2006.01)
*H01L 21/687* (2006.01)
*H01L 21/677* (2006.01)
*H01J 37/32* (2006.01)
*B44C 1/22* (2006.01)
*H05H 1/46* (2006.01)

(56) References Cited

U.S. PATENT DOCUMENTS

| | | | |
|---|---|---|---|
| 6,770,899 B2 | 8/2004 | Hasegawa et al. | |
| 6,901,314 B2 * | 5/2005 | Mitsui et al. | 700/245 |
| 2002/0104229 A1 * | 8/2002 | Shin et al. | 33/645 |
| 2002/0153477 A1 | 10/2002 | Hasegawa et al. | |
| 2006/0292714 A1 * | 12/2006 | Kim | 438/16 |
| 2007/0065144 A1 * | 3/2007 | Hofmeister et al. | 396/611 |
| 2008/0079920 A1 * | 4/2008 | Hommen et al. | 355/55 |
| 2010/0044359 A1 * | 2/2010 | Sawabe | 219/121.83 |
| 2010/0124610 A1 | 5/2010 | Aikawa et al. | |
| 2013/0068726 A1 * | 3/2013 | Okita et al. | 216/59 |

FOREIGN PATENT DOCUMENTS

| | | |
|---|---|---|
| JP | 2005-142200 | 6/2005 |
| JP | 2009-147375 | 7/2009 |
| JP | 2009-177190 | 8/2009 |
| JP | 2009-200142 | 9/2009 |
| JP | 2010-153769 | 7/2010 |

OTHER PUBLICATIONS

International Search Report issued Jun. 21, 2011 in International (PCT) Application No. PCT/JP2011/002909.

* cited by examiner

PLASMA PROCESSING APPARATUS AND PLASMA PROCESSING METHOD

TECHNICAL FIELD

The present invention relates to a plasma processing apparatus such as a dry etching apparatus or a CVD apparatus.

BACKGROUND ART

In a plasma processing apparatus, wafers serving as a processing target are supported by a support stand called a susceptor provided in a chamber. Then, a high-frequency voltage is applied to a hermetically-sealed chamber and a plasma generating gas is supplied thereto to generate plasma in the chamber. The wafers are exposed to the plasma and plasma processing such as dry etching is thereby executed on the wafers.

According to such plasma processing apparatus, a plurality of wafers are collectively supported by the support stand, so that a tray capable of housing the plurality of wafers is used (Japanese Patent Laid-open Publication No. 2009-147375, for example). The tray has a plurality of housing holes each having a diameter a little larger than that of the wafer. The wafer is housed in each housing hole. The tray housing the wafers is carried by a carrying mechanism after aligned and then supported by the support stand. Each wafer in the tray is electrostatically absorbed by an electrostatic absorption apparatus provided in the support stand through the tray. In addition, each wafer is cooled down by a cold gas (such as helium gas) supplied from a cold gas supply pipe line provided in the support stand through the tray.

SUMMARY OF THE INVENTION

Problems to be Solved by the Invention

However, as described above, according to the conventional plasma processing apparatus in which the wafers housed in the tray having the housing holes are collectively supported by the support stand, it is important to know whether or not the wafer is appropriately housed in the housing hole. That is, in the case where the wafer housed in the housing hole in the tray runs on an inner edge of the housing hole and is misaligned, the cold gas to cool down the wafer does not sufficiently spread on a lower face of the wafer. As a result, the wafer which is not sufficiently cooled down is exposed to high-temperature plasma, so that a resist could be burned.

Thus, it is an object of the present invention to prevent the plasma processing from being executed on the wafer which is misaligned with respect to the housing hole.

Means for Solving the Problems

According to a first aspect of the present invention, a plasma processing apparatus comprises, a stock unit for supplying and collecting a conveyable tray formed with a plurality of housing holes in each of which a wafer is housed, a processing unit for executing plasma processing on the wafers housed in the tray supplied from the stock unit, an alignment unit comprising a table on which alignment process to the tray is executed; and a housing state detection unit for detecting whether or not the wafer housed in each of the housing holes in the tray set on the table in the alignment unit is misaligned with respect to the corresponding housing hole, wherein the housing state detection unit comprises a height detection unit for detecting a height at a wafer side target point of a surface of the wafer housed in each of the plurality of housing holes in the tray set on the table, and a determination unit for determining whether or not the wafer is misaligned with respect to the corresponding housing hole, based on the height of the surface of the wafer at the wafer side target point detected by the height detection unit.

The tray is set on the table in the alignment unit for positioning before the plasma processing is executed in the processing unit. The housing state detection unit detects whether or not the wafer in the housing hole is misaligned in the tray on the table. As a result, in the case where there is the housing hole in which the wafer is misaligned among the housing holes of the tray, that tray is not subjected to the plasma processing in the processing unit.

Still more specifically, the height detection unit further detects a height of a surface of the tray at a tray side target point opposed to the wafer side target point across a hole edge of the housing hole, and the determination unit determines whether or not the wafer is misaligned with respect to the corresponding housing hole, based on a comparison between the height of the surface of the wafer at the wafer side measuring point and the height of the surface of the tray at the tray side target point.

In addition, the misalignment of the wafer can be detected with high precision by comparing the height of the surface of the wafer in the wafer side target point with the height of the surface of the tray in the tray side target point.

It is preferred that the determination unit further determine whether or not the wafer exists in each of the housing holes, based on the height of the wafer side target point detected by the height detection unit.

The table may be a rotating table for rotating the tray in a horizontal plane. In this case, the housing state detection unit detects whether or not the wafer housed in each of the housing holes in the tray is misaligned with respect to the corresponding housing hole while the tray is rotated by the rotating table.

According to this configuration, the heights of the wafers in the plurality of housing holes can be detected by one height detection unit whose direction is fixed, or images of the wafers in the plurality of housing holes can be taken by one imaging unit whose viewing field is fixed in a wafer presence detection unit.

The plasma processing apparatus may further include an alarm generation unit for generating an alarm when the housing state detection unit detects the misaligned wafer in any of the housing holes in the tray.

According to a second aspect of the present invention, a plasma processing method includes carrying a tray formed with a plurality of housing holes in each of which a wafer is housed from a stock unit to an alignment unit, and setting the tray on a table, detecting a height at a wafer side target point of a surface of the wafer housed in each of the plurality of housing holes, determining whether or not the wafer is misaligned with respect to the corresponding housing hole, based on the height of the surface of the wafer at the detected wafer side target point, carrying the tray from the alignment unit to a processing unit and executing plasma processing when the wafer is housed in all of the housing holes of the tray on the table without being misaligned, and returning the tray from the alignment unit to the stock unit when the wafer is misaligned in any of the housing holes of the tray on the table.

Effect of the Invention

According to the present invention, it is determined whether or not the wafer housed in each of the plurality of housing holes of the tray is misaligned with respect to the corresponding housing hole, in the stage of the positioning of the tray in the alignment unit before the plasma processing is executed on the wafer in the processing unit. In the case where there is the wafer which is misaligned with respect to the corresponding housing hole, the tray can be returned to the stock unit without being carried to the processing unit. As a result, it becomes possible to prevent the wafer which is not sufficiently cooled down due to the misalignment with respect to the housing hole from being exposed to high-temperature plasma, so that the resist can be prevented from being burned in the wafer.

MODE FOR CARRYING OUT THE INVENTION (First Embodiment)

Figure 1:
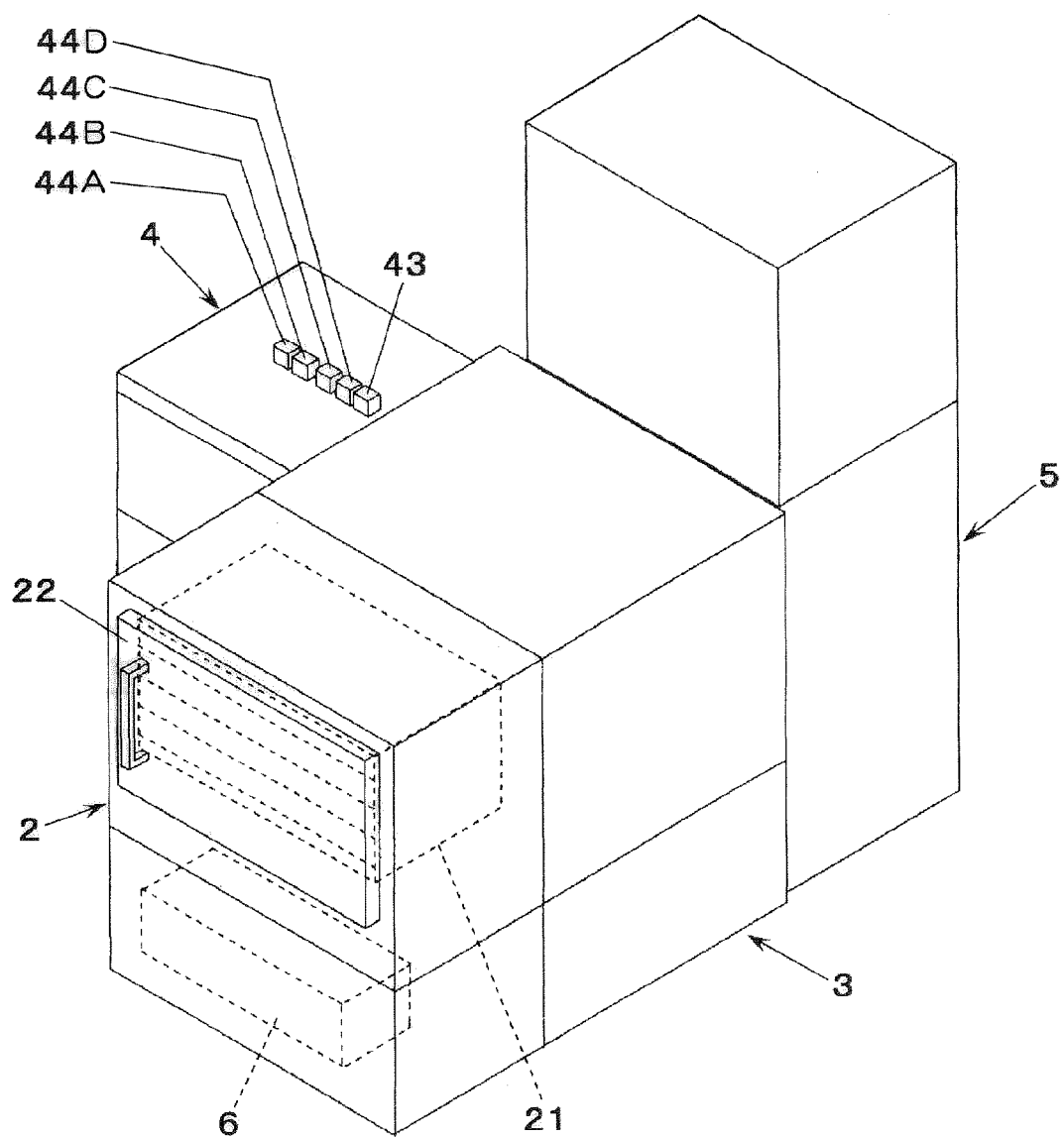
FIG. 1 is a perspective view of a plasma processing apparatus according to a first embodiment of the present invention.
Figure 2:
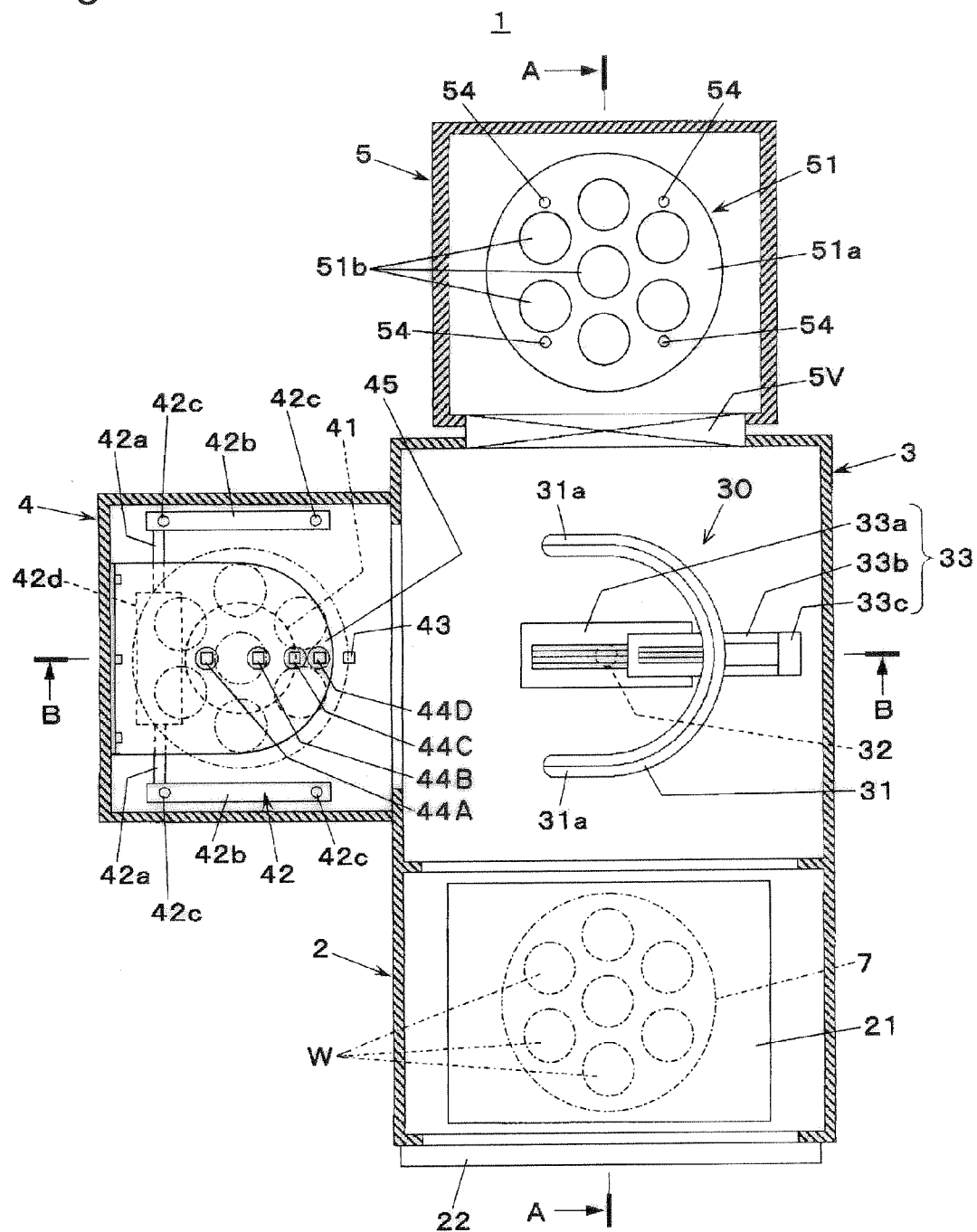
FIG. 2 is a cross-sectional plan view of the plasma processing apparatus according to the first embodiment of the present invention.
Figure 3:
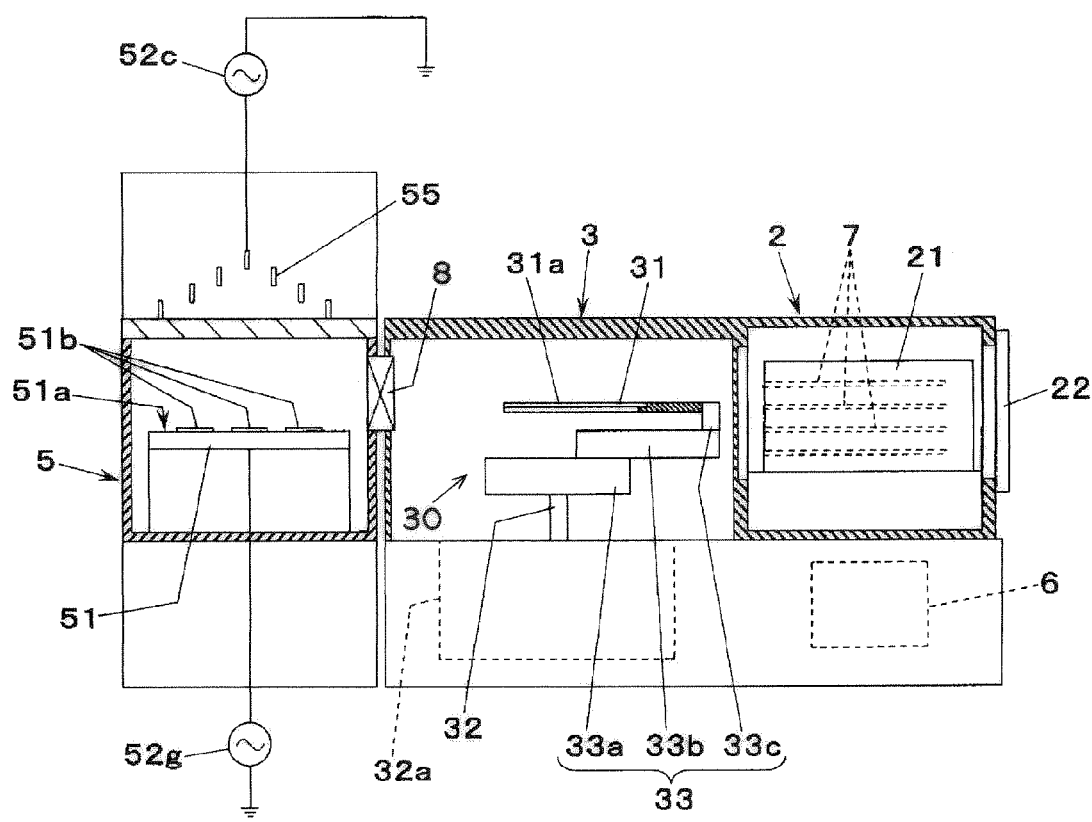
FIG. 3 is a cross-sectional side view of the plasma processing apparatus according to the first embodiment of the present invention.
Figure 4:
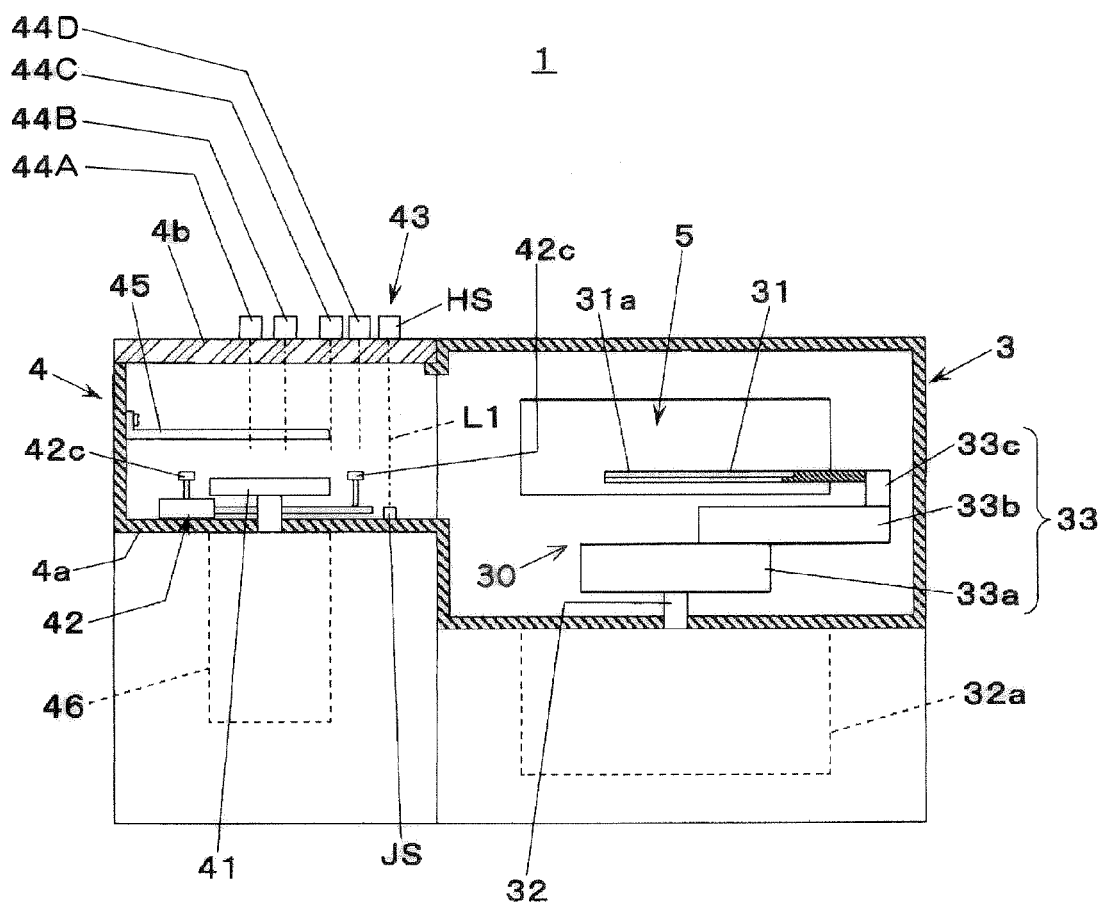
FIG. 4 is a cross-sectional side view of the plasma processing apparatus according to the first embodiment of the present invention.

Referring to FIGS. 1 to 4, a plasma processing apparatus 1 in a first embodiment of the present invention executes plasma processing (such as dry etching) on a processing target, and includes a stock unit 2, a carrier chamber (carrier unit) 3, an alignment chamber (alignment unit) 4, a processing chamber (processing unit) 5, and a control apparatus 6 (FIGS. 1 and 3). Here, FIG. 3 is a cross-sectional arrow view taken along a line A-A in FIG. 2, and FIG. 4 is a cross-sectional arrow view taken along a line B-B in FIG. 2.

Figure 5A:
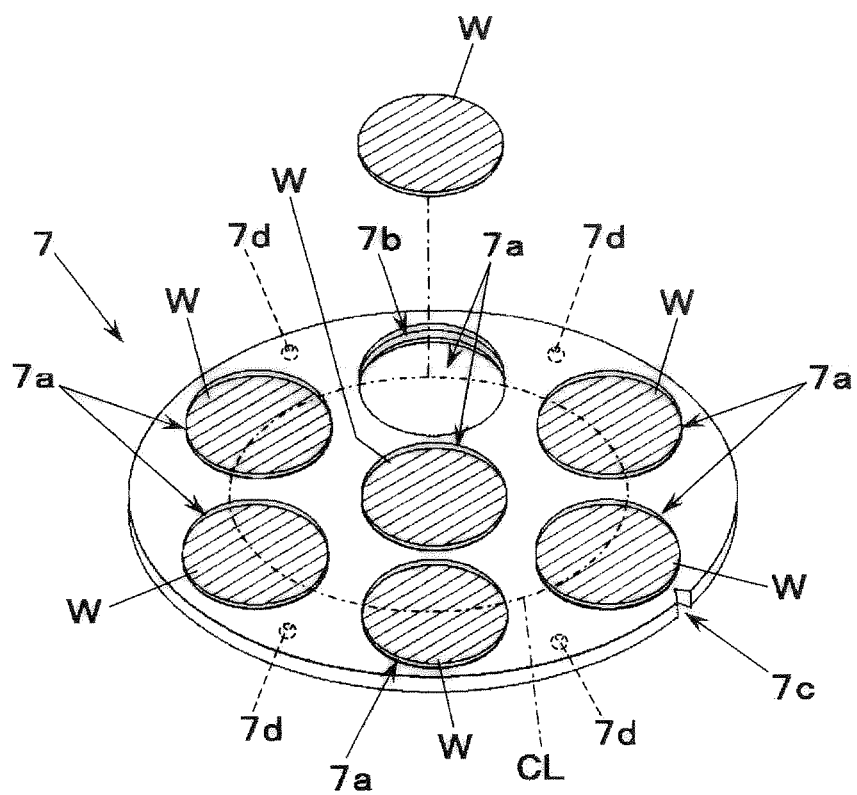
FIG. 5A is a perspective view of a tray provided in the plasma processing apparatus according to the first embodiment of the present invention.
Figure 5B:
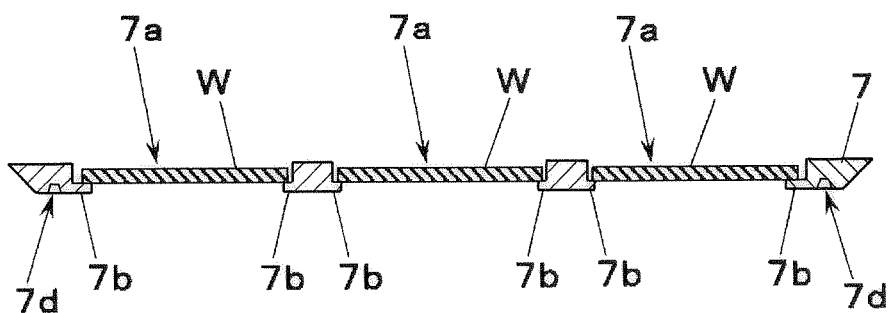
FIG. 5B is a side cross-sectional view of the tray provided in the plasma processing apparatus according to the first embodiment of the present invention.

In this plasma processing apparatus 1, a conveyable tray 7 as shown in FIGS. 5A and 5B is used so that a plurality of wafers W serving as processing targets can be processed at the same time. This tray 7 is a disk-shaped thin plate member, and formed of an electric insulating material such as a ceramic material. The tray 7 is formed with a plurality of (seven in this case) circular housing holes 7a each penetrating in a thickness direction and each having a diameter a little larger than that of the wafer W. A ring-shaped extension which extends inward of the housing hole 7a is provided around a lower edge of an inner periphery of the housing hole 7a. The extension 7b supports an outer edge of the lower face of the wafer W housed in the housing hole 7a. After the wafer W has been housed in the housing hole 7a with its outer edge supported from below by the extension 7b, the lower face of the wafer W is exposed downward in the housing hole 7a (FIG. 5B).

As shown in FIG. 5A, the tray 7 in the present embodiment houses one wafer W in the one housing hole 7a arranged in a center position of the tray 7. In addition, the six housing holes 7a are arranged such that their centers are positioned at the same intervals on a virtual circle CL formed around the center position of the tray 7 and the six housing holes 7a house the six wafers W, respectively.

Referring to FIGS. 1, 2, and 3, the stock unit 2 of the plasma processing apparatus 1 in the present embodiment is provided with a cassette 21 which houses the plurality of trays 7 (the wafer W is housed in each housing hole 7a in the tray 7) in a detachable manner. The cassette 21 can be externally accessed through an opening/closing door 22 provided in the stock unit 2.

Referring to FIGS. 2, 3, and 4, the carrier chamber 3 is provided adjacent to the stock unit 2, and houses a carrying mechanism 30 for carrying the tray 7. The carrying mechanism is provided with a carrier arm 31. This carrier arm 31 has two parallel projection units 31a which are in a shape of "U" in a planar view, and is attached to a horizontal transferring mechanism 33 provided on an upper part of a rotating shaft 32 which is rotatable around a vertical axis.

Referring to FIGS. 2, 3, and 4, the horizontal transferring mechanism 33 has a base stage 33a fixed to an upper end of the rotating shaft 32 and extending in a horizontal plane direction, a lower stage 33b provided on the base stage 33a so as to be transferable in the extending direction of the base stage 33a, and an upper stage 33c provided on the lower stage 33b so as to be transferable in the extending direction of the base stage 33a. The carrier arm 31 is mounted on the upper stage 33c in such a manner that an extending direction of the two projection units 31a coincides with the extending direction of the base stage 33a.

The carrier arm 31 is rotated in the horizontal plane together with the rotation of the rotating shaft 32, and is transferred in the horizontal plane when the upper stage 33c is transferred in the horizontal plane with respect to the lower stage 33b, which is linked with the transfer of the lower stage 33b of the horizontal transferring mechanism 33 in the horizontal plane with respect to the base stage 33a.

Figure 6:
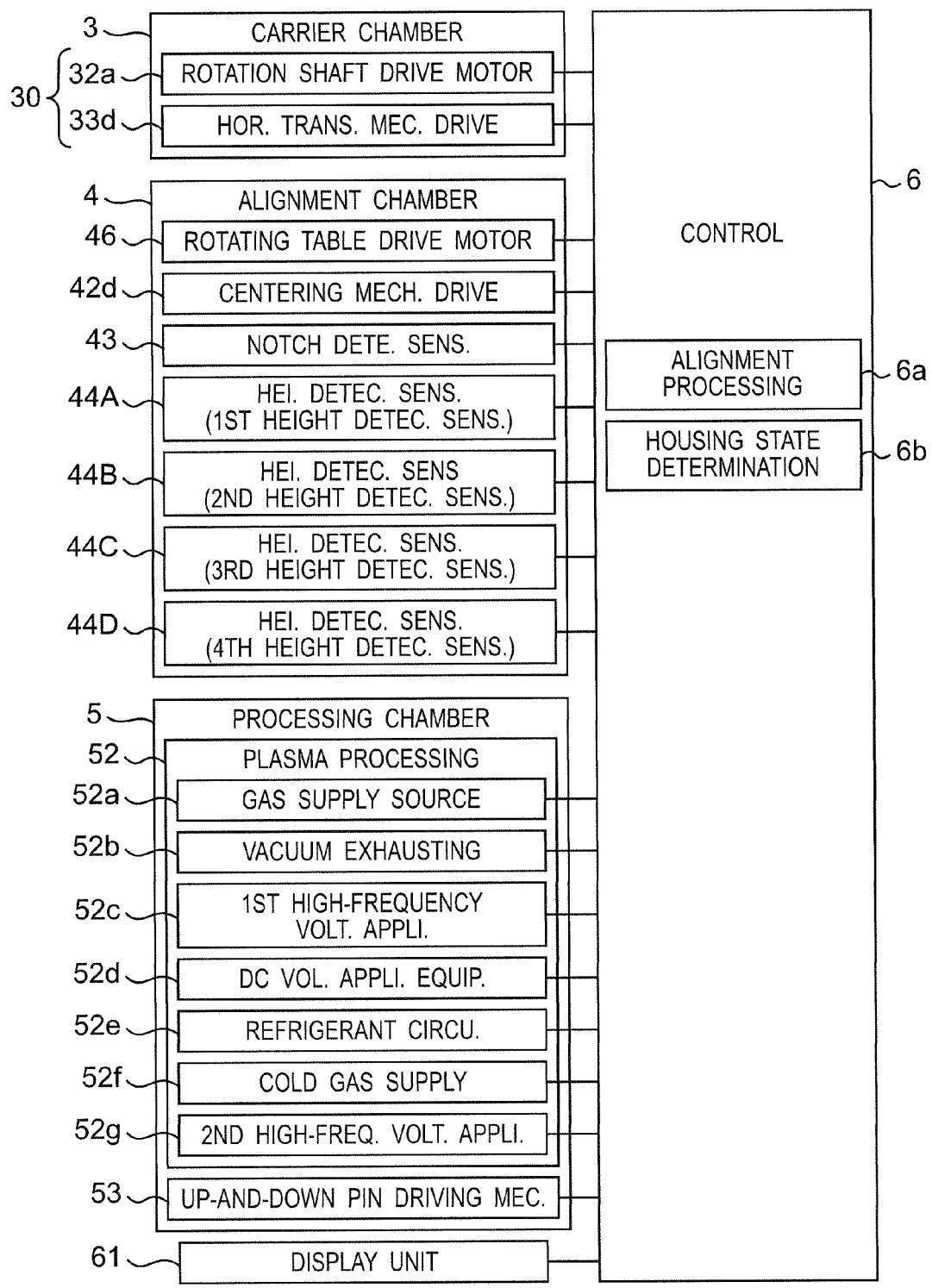
FIG. 6 is a block diagram showing an action system of the plasma processing apparatus according to the first embodiment of the present invention.

The rotating action of the carrier arm 31 in the horizontal plane (the rotating action of the rotating shaft 32) is carried out by an action of a rotating shaft drive motor 32a controlled by the control device 6 (refer to FIGS. 3, 4, and 6). In addition, the transfer action of the carrier arm 31 in the horizontal plane (the transfer action of the lower stage 33b in the horizontal plane with respect to the base stage 33a, and the transfer action of the upper stage 33c in the horizontal plane with respect to the lower stage 33b) is carried out by an action of a horizontal transferring mechanism drive unit 33d (FIG. 6) provided in the horizontal transferring mechanism 33 controlled by the control device 6. Thus, the control device 6 rotates the carrier arm 31 in the horizontal plane, and transfers the carrier arm 31 in the horizontal plane so that the tray 7 is carried from the stock unit 2 to the alignment chamber 4, the tray 7 is carried from the alignment chamber 4 to the processing chamber 5, the tray 7 is carried from the processing chamber 5 to the alignment chamber 4, and carry the tray 7 from the alignment chamber 4 to the stock unit 2.

Referring to FIGS. 2 and 4, the alignment chamber 4 is provided adjacent to the carrier chamber 33. As also shown in FIG. 7, the alignment chamber 4 includes, in its inside, a rotating table 41, a centering mechanism 42, a notch detecting sensor 43 serving as a transmission type optical sensor (optical sensor in which inspection light from a projector is directly received by a receiver), four height detecting sensors 44A, 44B, 44C, and 44D each serving as a reflection type optical sensor (optical sensor in which reflection light of projected inspection light is received by itself), and a temporary tray table 45.

Figure 7:
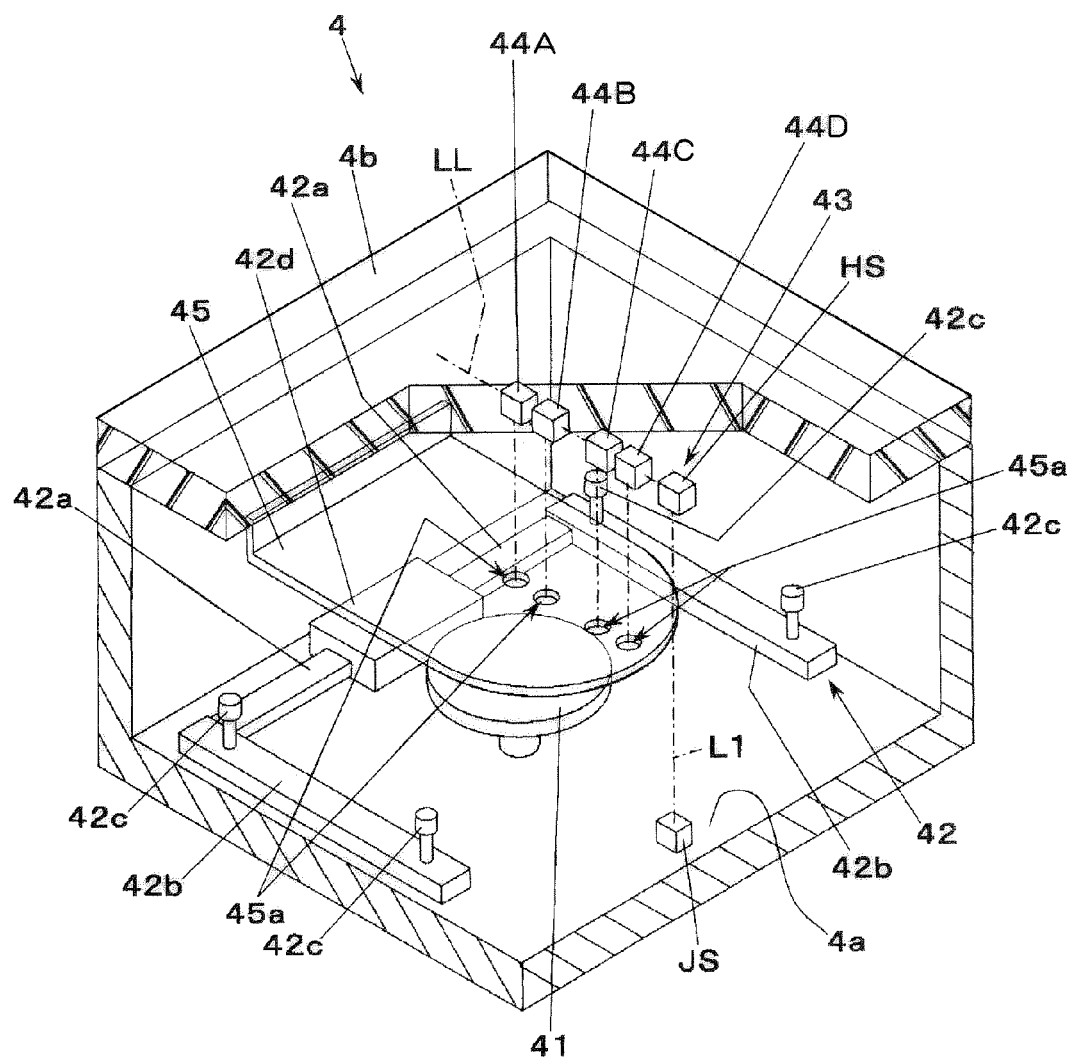
FIG. 7 is a cross-sectional perspective view of an alignment chamber provided in the plasma processing apparatus according to the first embodiment of the present invention.

Referring to FIGS. 4 and 7, the rotating table 41 is rotatably provided in the horizontal plane with respect to a bottom plate unit 4a of the alignment chamber 4, on which the tray 7 (each housing hole 7a of the tray 7 houses the wafer W) supplied from the stock unit 2 by the carrier arm 31 in the carrier chamber 3 is set.

The rotating table 41 is rotated by an action of a rotating table drive motor 46 (refer to FIGS. 4 and 6) provided under the bottom plate unit 4a, and thus, the tray 7 on the rotating table 41 is rotated in the horizontal plane.

Figure 8:
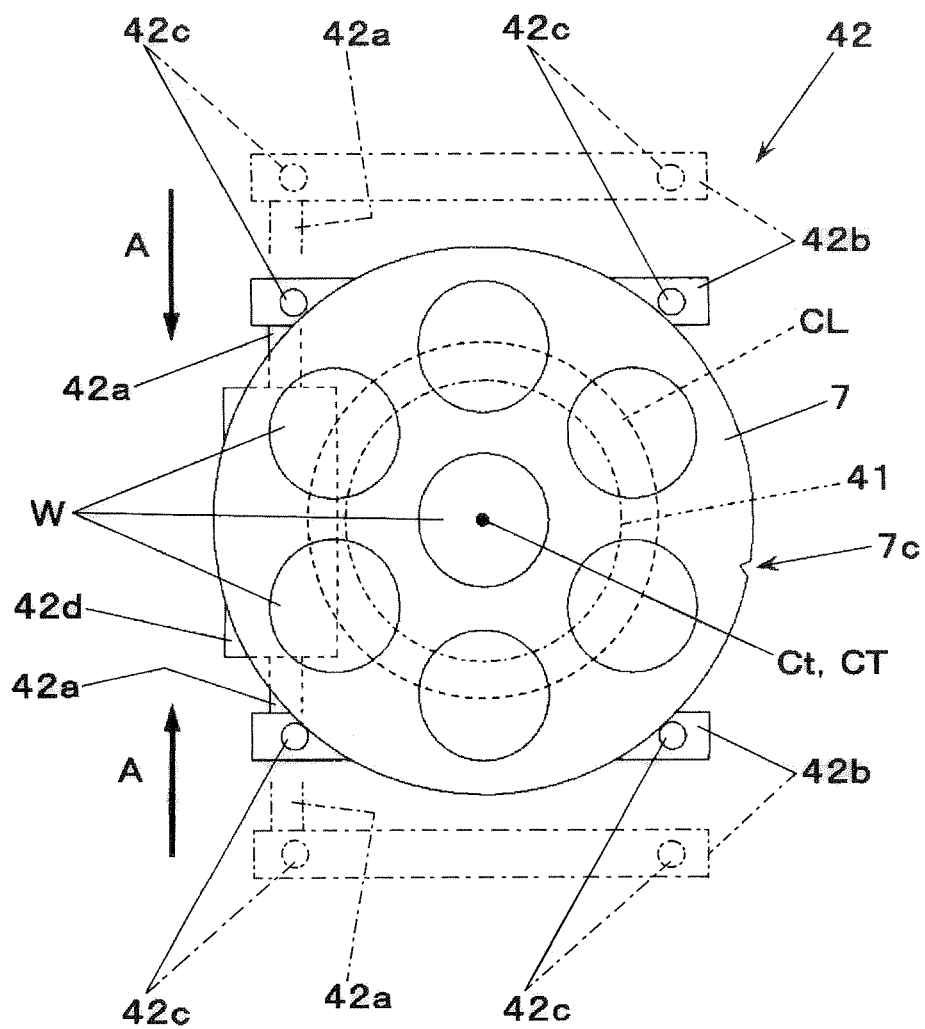
FIG. 8 is a view to describe an action of a centering mechanism in the alignment chamber provided in the plasma processing apparatus according to the first embodiment of the present invention.

As shown in FIGS. 2, 7, and 8, the centering mechanism 42 includes a pair of vertical direction members 42a provided on the bottom plate unit 4a of the alignment chamber 4 so as to synchronously come close to or get away from each other along the same axis in the horizontal plane, and a pair of horizontal direction members 42b each having one end fixed to the vertical direction member 42a and extending in the horizontal plane direction perpendicular to the vertical direction member 42a. Four abutment members 42c in total are provided such that two of them are arranged in a standing manner in each horizontal direction member 42b. As the pair of vertical direction members 42a comes close to or gets away from each other, the pair of horizontal direction members 42b accordingly comes close to or gets away from each other. Here, the coming-close action and the getting-away action of the pair of vertical direction members 42a (that is, the coming-close action and the getting-away action of the pair of horizontal direction members 42b) are carried out by an action of a centering mechanism drive unit 42d provided between the pair of vertical direction members 42a and controlled by the control device 6.

Under the control of the control device 6, the carrier arm 31 in the carrier chamber 3 is transferred in the horizontal plane, and sets the tray 7 on the rotating table 41. Then, the control device 6 controls the action of the centering mechanism drive unit 42d and actuates the pair of vertical direction members 42a (that is, the pair of horizontal direction members 42b) so that they come close to each other (shown by an arrow A in FIG. 8) and sandwich the tray 7 with the four abutment members 42c provided in the standing manner in the pair of horizontal direction members 42b abutted on an outer edge of the tray 7 (refer to the abutment member 42c shown by a solid line in FIG. 8). Thus, the tray 7 on the rotating table 41 is transferred to a position at which a center position ct (FIG. 8) of the tray 7 coincides with a center position CT (FIG. 8) of the rotating table 41, so that center alignment (centering) is made with respect to the rotating table 41.

After performing the centering of the tray 7, the control device 6 controls the action of the centering mechanism drive unit 42d so that the pair of vertical direction members 42a (that is, the pair of horizontal direction members 42b) gets away from each other. Thus, the four abutment members 42c get away from the tray 7, so that the tray 7 can be rotated with the rotation action of the rotating table 41. In addition, according to the present embodiment, as shown in FIG. 8, after the tray 7 has been centered by the centering mechanism 42, an outer edge of the rotating table 41 is positioned in an inner region of the virtual circle CL of the tray 7.

Figure 9:
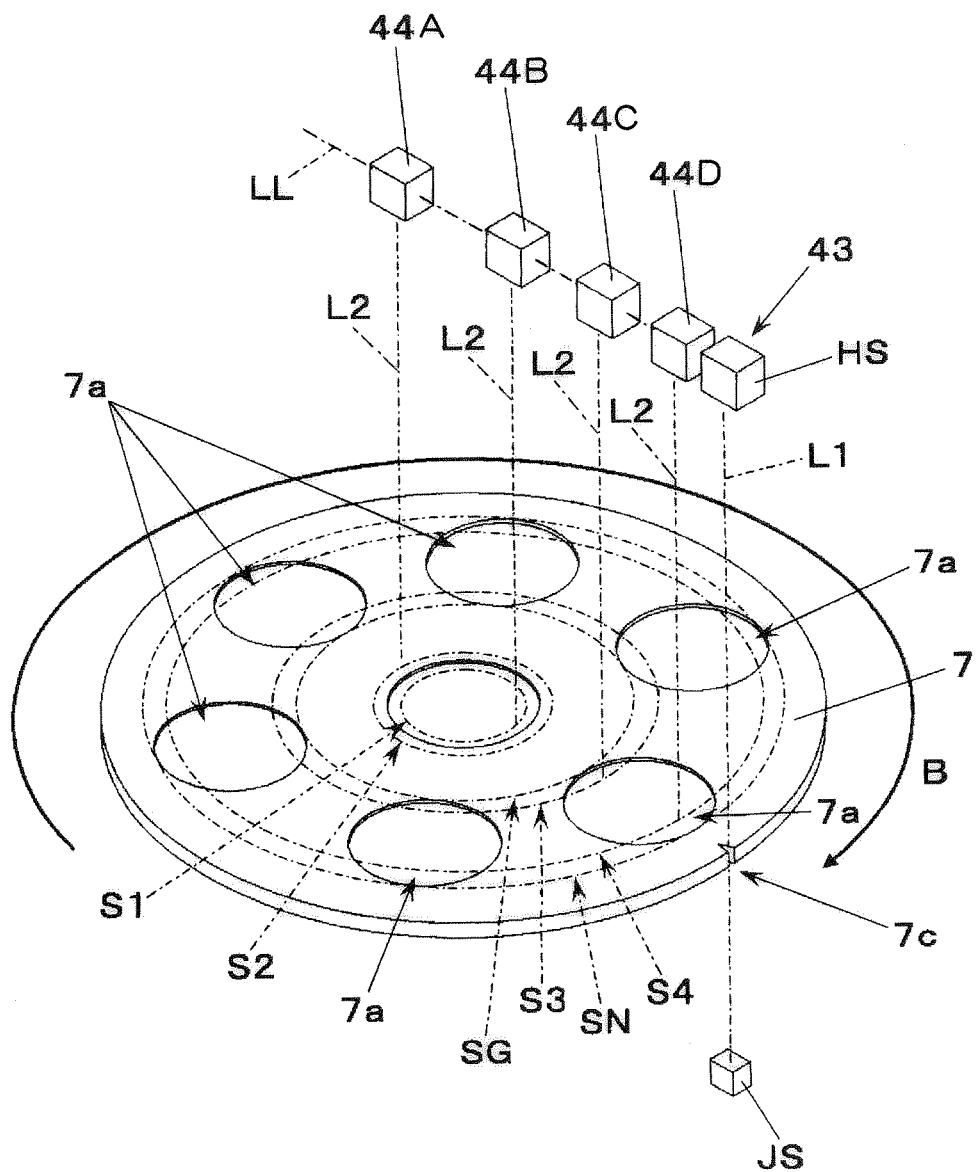
FIG. 9 is a view showing a positional relationship between a notch detecting sensor, a height detecting sensor, and the tray in the alignment chamber provided in the plasma processing apparatus according to the first embodiment of the present invention.

Referring to FIGS. 7 and 9, the notch detecting sensor 43 has a light projector HS provided on a ceiling unit 4b (FIGS. 4 and 7) of the alignment chamber 4 to project inspection light L1 downward, and a light receiver JS provided on the bottom plate unit 4a just under the light projector HS. According to the first embodiment, the ceiling unit 4b of the alignment chamber 4 is made of a transparent member such as an acrylic plate, and the notch detecting sensor 43 is provided on an upper face of the ceiling unit 4b, so that the inspection light L1 projected from the light projector HS is applied downward through the ceiling unit 4b. However, the light projector HS of the notch detecting sensor 43 may be provided on a lower face of the ceiling unit 4b (the same is applied to four height detecting sensors 44A to 44D).

Referring to FIG. 9, the light projector HS of the notch detecting sensor 43 is arranged at a position so that when the tray 7 which has been centered by the centering mechanism 42 is rotated by the rotating table 41, the inspection light L1 projected from the light projector HS can vertically pass through a notch 7c formed by partially notching the outer edge of the tray 7. The light receiver JS of the notch detecting sensor 43 is arranged at a position so that after the inspection light L1 has been projected from the light projector HS and vertically passed through the notch 7c, the inspection light L1 can be received.

Thus, the notch detecting sensor 43 projects the inspection light L1 from the light projector HS and observes a light receiving state of the inspection light L1 by the light receiver JS while the rotating table 41 having the tray 7 placed thereon is rotated (shown by an arrow B in FIG. 9), so that the notch detecting sensor 43 can detect the position of the notch 7c in the tray 7. An alignment processing unit 6a (FIG. 6) of the control device 6 regards a rotating angle of the tray 7 (rotating angle of the rotating table 41 around a rotation axis) when the position of the notch 7c is detected by the notch detecting sensor 43, as 0 degree (original position). Note that the rotating action of the rotating table 41 in detecting the notch 7c is carried out by the action of the rotation table drive motor 46 controlled by the alignment processing unit 6a of the control device 6.

According to the present embodiment, the notch detecting sensor 43 and the alignment processing unit 6a of the control device 6 serve as a rotation direction positioning unit to perform the positioning of the tray 7 in the rotation direction while rotating the tray 7 with the rotating table 41. Thus, the rotation direction positioning unit and the centering mechanism 42 serve as a tray positioning unit to perform the positioning of the tray 7 with respect to the table (rotating table 41) in the alignment chamber 4.

Refer to FIGS. 7 and 9, the four height detecting sensors 44A to 44D are set in the alignment chamber 4 as described above. Each of the height detecting sensors 44A to 44D includes an irradiating unit for irradiating a height detection target point with inspection light L2 such as a laser beam, and a light receiving unit for detecting a position of the inspection light reflected at the height detection target point, and measures a height of the height detection target point from the position of the reflected inspection light L2 based on a principle of triangulation. Each of the four height detecting sensors 44A to 44D detects whether or not the wafer W housed in each of the seven housing holes 7a in the tray 7 runs on the hole edge of the corresponding housing hole 7a and is misaligned. The height detecting sensors 44A to 44D find heights of several height detection target points (four points here) near an outer edge of the surface of the wafer W, and heights of several height detection target points (four points here) of the tray 7 positioned near the height detection target points on the wafer W. More specifically, each of the four height detecting sensors 44A to 44D irradiates the wafer W housed in the housing hole 7a of the tray 7 on the rotating table 41, or the surface of the tray 7 near the housing hole 7a, with the inspection light L2, and detects the height of the height detection target point of the surface of the wafer W or the tray 7, based on the reflected light of the inspection light L2 from the surface of the tray 7 or the wafer W.

Here, as shown in FIG. 7, the temporary tray table 45 has through holes penetrating in a thickness direction and formed at several positions of the temporary tray table 45 in order to prevent the inspection light L2 from each of the height detecting sensors 44A to 44D and the reflected light of the inspection light L2 from the wafer W or the tray 7 from being blocked by the temporary tray table 45.

Referring to FIGS. 7 and 9, there are the four height detecting sensors such as the first height detecting sensor 44A, the second height detecting sensor 44B, the third height detecting sensor 44C, and the fourth height detecting sensor 44D. According to the first embodiment, the four height detecting sensors 44A to 44D are arranged along a line LL which passes through a position just above the center of the rotating table 41 and extending in the horizontal plane.

The first height detecting sensor 44A has a center in common with the housing hole 7a provided in the center of the tray 7, and irradiates a virtual circle S1 (FIGS. 9 and 10) whose radius is a little smaller than that of the housing hole 7a with the inspection light L2, and detects the height of the surface of the wafer W on the virtual circle S1. A direction of the inspection light L2 from the first height detecting sensor 44A is fixed. However, as the tray 7 on the rotating table 41 is rotated in the horizontal plane, the first height detecting sensor 44A detects the heights at a plurality of points of the surface of the wafer W on the virtual circle S1. More specifically, the first height detecting sensor 44A detects the heights at four height detection target points (wafer side target points) P1, P2, P3, and P4 on the virtual circle S1. The height detection target points P1 to P4 are positioned near the outer edge of the surface on the wafer W, and arranged at the same angular intervals (interval of 90°) with respect to the center of the wafer W in a planar view.

Figure 10:
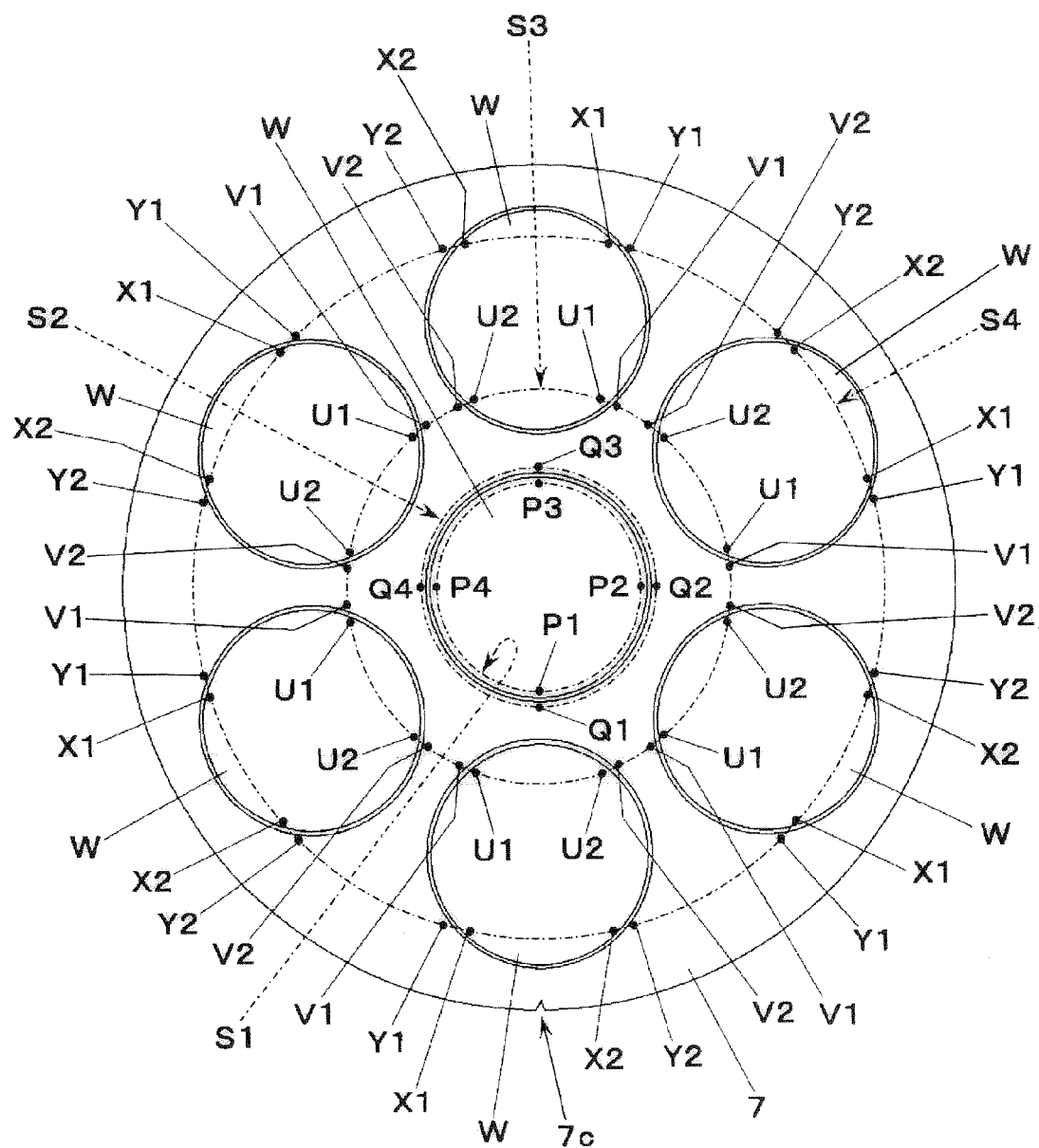
FIG. 10 is a view showing the tray provided in the plasma processing apparatus and height detection target points of the wafer housed in this tray provided in the plasma processing apparatus according to the first embodiment of the present invention.

The second height detecting sensor 44B has a center in common with the housing hole 7a provided in the center of the tray 7, and irradiates a virtual circle S2 (FIGS. 9 and 10)

whose radius is a little larger than that of the housing hole 7a with the inspection light L2, and detects the height of the surface of the tray 7 on the virtual circle S2. A direction of the inspection light L2 from the second height detecting sensor 44B is fixed. However, as the tray 7 on the rotating table 41 is rotated in the horizontal plane, the second height detecting sensor 44B detects the heights at a plurality of points of the surface of the tray 7 on the virtual circle S2. More specifically, the second height detecting sensor 44B detects the heights at four height detection target points (tray side target points) Q1, Q2, Q3, and Q4 on the virtual circle S2. The height detection target points Q1 to Q4 are positioned near the hole edge of the housing hole 7a in the center, and arranged at the same angular intervals (interval of 90°) with respect to the center of the housing hole 7a in a planar view. In addition, the positions of the height detection target points Q1 to Q4 are set so as to be opposed to the height detection target points P1 to P4, respectively across the hole edge of the housing hole 7a in the center.

The third height detecting sensor 44C irradiates a virtual circle S3 (FIGS. 9 and 10) having a radius a little larger than a virtual circle SG (FIG. 9) which is tangent to the six housing holes 7a provided around the periphery positions of the tray 7 on a side of the center of the tray 7 with the inspection light L2, and detects the heights of the surfaces of the wafer W and the tray 7 on the virtual circle S3. A direction of the inspection light L2 from the third height detecting sensor 44C is fixed. However, as the tray 7 on the rotating table 41 is rotated in the horizontal plane, the third height detecting sensor 44C detects the heights of several points on the virtual circle S3. More specifically, the third height detecting sensor 44C detects heights of two height detection target points (wafer side target points) U1 and U2 (12 points in total) near the outer edge of the surface of the wafer W in the housing hole 7a with respect to each of the six housing holes 7a arranged around the periphery positions of the tray 7. In addition, the third height detecting sensor 44C detects heights of two height detection target points (tray side target points) V1 and V2 (12 points in total) of the surface of the tray 7 opposed to the two height detection target points U1 and U2 across the hole edge of the housing hole 7a, with respect to each of the six housing holes 7a.

The fourth height detecting sensor 44D irradiates a virtual circle S4 (FIGS. 9 and 10) having a radius a little smaller than a virtual circle SN (FIG. 9) which is tangent to the six housing holes 7a provided around the periphery positions of the tray 7 on a side of the outer periphery of the tray 7 with the inspection light L2, and detects the heights of the surfaces of the wafer W and the tray 7 on the virtual circle S4. A direction of the inspection light L2 from the fourth height detecting sensor 44D is fixed. However, as the tray 7 on the rotating table 41 is rotated in the horizontal plane, the fourth height detecting sensor 44D detects the heights of a plurality of points on the virtual circle S4. More specifically, the fourth height detecting sensor 44D detects heights of two height detection target points (wafer side target points) X1 and X2 (12 points in total) near the outer edge of the surface of the wafer W in the housing hole 7a with respect to each of the six housing holes 7a arranged around the periphery positions of the tray 7. In addition, the fourth height detecting sensor 44D detects heights of two height detection target points (tray side target points) Y1 and Y2 (12 points in total) of the surface of the tray 7 opposed to the two height detection target points X1 and X2 across the hole edge of the housing hole 7a, with respect to each of the six housing holes 7a.

A housing state determination unit 6b of the control device 6 (FIG. 6) compares the heights of the four couples of the height detection target points for the wafer W housed in the housing hole 7a positioned in the center of the tray 7, that is, the heights between the height detection target points P1 and Q1, the height detection target points P2 and Q2, the height detection target points P3 and Q3, and the height detection target points P4 and Q4. The height detection target points P1 to P4 are detected by the first height detecting sensor 44A, and the height detection target points Q1 to Q4 are detected by the second height detecting sensor 44B. Based on this comparison, the housing state determination unit 6b determines a housing state of the wafer W with respect to the corresponding housing hole 7a. More specifically, the housing state determination unit 6b determines whether or not the wafer W runs on the hole edge of the housing hole 7a of the tray 7 and is inclined, that is, determines whether or not the wafer W is misaligned with respect to the housing hole 7a.

In addition, the housing state determination unit 6b compares the heights of the four couples of the height detection target points for the wafer W housed in each of the six housing holes 7a provided around the periphery positions of the tray 7, that is, the heights between the height detection target points U1 and V1, the height detection target points U2 and V2, the height detection target points X1 and Y1, and the height detection target points X2 and Y2. The height detection target points U1, U2, V1, and V2 are detected by the third height detecting sensor 44C, and the height detection target points X1, X2, Y1, and Y2 are detected by the fourth height detecting sensor 44D. Based on this comparison, the housing state determination unit 6b determines a housing state of the wafer W with respect to the corresponding housing hole 7a, that is, determines whether or not the misalignment occurs.

The determination of the misalignment is specifically made by the housing state determination unit 6b as follows.

First, the height of the height detection target point on the wafer W is compared with the height of the height detection target point of the tray 7 opposed thereto across the hole edge of the housing hole 7a. As for the wafer W in the center of the tray 7, the heights of the height detection target points P1 to P4 on the wafer W are compared with the heights of the height detection target points Q1 to Q4 on the tray 7, respectively. In addition, as for each of the six wafers W on the outer periphery side of the tray 7, the heights of the height detection target points U1, U2, X1, and X2 on the wafer are compared with the heights of the height detection target points V1, V2, Y1, and Y2 on the tray 7, respectively. More specifically, differences are found between the height detection target points P1 to P4, U1, U2, X1, and X2 and the corresponding height detection target points Q1 to Q4, V1, V2, Y1, Y2, respectively.

Then, the found difference in height is evaluated. More specifically, when the differences between the four height detection target points on the one wafer W and the corresponding height detection target points of the tray 7 are all within a predetermined range, it is determined that the wafer W is not misaligned with respect to the corresponding housing hole 7a. However, when any of the differences between the four height detection target points on the one wafer W and the corresponding height detection target points of the tray 7 is larger than the predetermined range, it is determined that the wafer W is misaligned with respect to the corresponding housing hole 7a. For example, as for the wafer W in the center, the differences are found by subtracting the heights of the height detection target points Q1 to Q4 of the tray from the heights of the height detection target points P1 to P4 of the wafer W, respectively, and it is determined whether or not the misalignment occurs based on whether or not the differences are all within the predetermined range.

Instead of this determination criterion, or in addition to this determination criterion, the following criterion may be used.

In the case where a variation in differences between the four height detection target points on the one wafer W and the corresponding height detection target points of the tray 7 falls within a predetermined range, it is determined that the differences between the four height detection target points on the one wafer W and the corresponding height detection target points of the tray 7 are roughly the same. In this case, it is determined that the wafer is not misaligned with respect to the corresponding housing hole 7a. Conversely, in the case where the variation in differences between the four height detection target points on the wafer W and the corresponding height detection target points of the tray 7 does not fall within the predetermined range, it is determined that the wafer W is misaligned with respect to the corresponding housing hole 7a.

As described above, each of the plurality of (four in this case) height detecting sensors 44A to 44D in the plasma processing apparatus 1 according to the first embodiment function as a height detection unit to detect the heights of the plurality of points on the surface of the wafer W housed in each of the housing holes 7a in the tray 7 set on the rotating table 41, and the housing state determination unit 6b of the control device 6 functions as a determination unit to determine whether or not the wafer W housed in each of the housing holes 7a in the tray 7 is misaligned with respect to the corresponding housing hole 7a, based on the heights of the several points on the surface of the wafer W detected by the height detecting means (each of the four height detecting sensors 44A to 44D). Each of the height detecting sensors 44A to 44D (height detecting unit) and the housing state determination unit 6b (determining unit) constitute a housing state detection unit in the present invention. In addition, the rotation of the rotating table 41 in detecting the heights of the height detection target points is carried out by the action of the rotating table drive motor 46 controlled by the housing state determination unit 6b of the control device 6.

According to the present embodiment, since the height detection target points P1 to P3, U1, U2, X1, and X2 of the wafer W are set at the positions near the outer edge on the surface of the wafer W, the determination on the misalignment is minimally affected by a warpage of the wafer W. In addition, since the misalignment of the wafer W is determined by the differences between the heights of the height detection target points of the wafer W and the heights of the height detection target points of the corresponding tray 7 as described above, the determination is not affected by an error in parallelism of the rotating table 41, an error caused by abrasion of the tray 7 due to etching, and an error due to warpage or deformation of the tray 7.

Referring to FIGS. 2 and 3, the processing chamber 5 is connected to the carrier chamber 3 through a gate valve 8, and the processing chamber 5 functions as a vacuum case separately from the carrier chamber 3 when the gate valve is closed. The processing chamber 5 is provided with a susceptor 51 serving as a support stand to support the wafers W in the tray 7, and provided with a plasma processing unit 52 (FIG. 6) for executing the plasma processing on the wafers W supported by the susceptor 51.

Figure 11A:
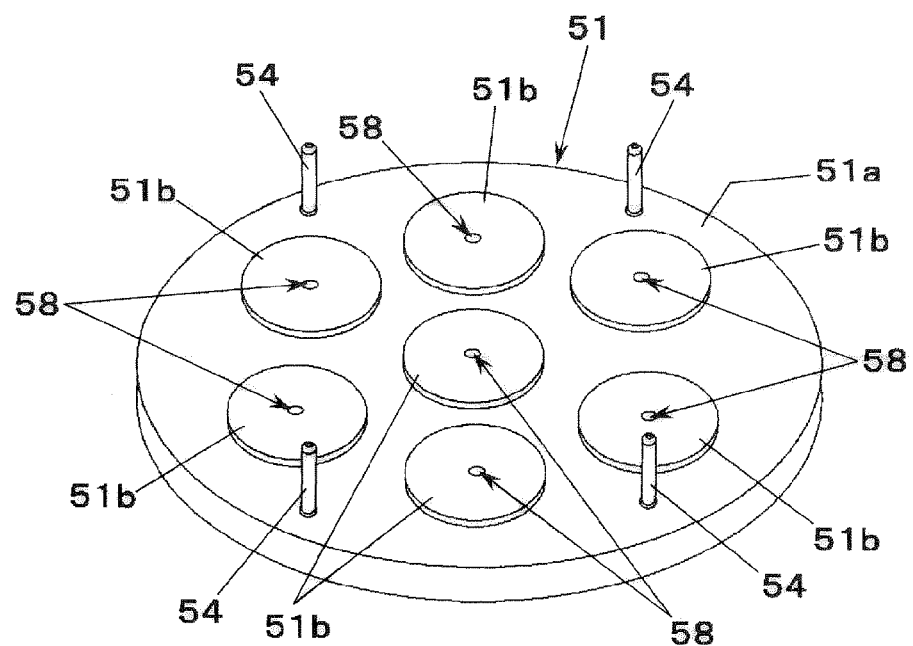
FIG. 11A is a perspective view of a susceptor in a processing chamber provided in the plasma processing apparatus according to the first embodiment of the present invention.
Figure 11B:
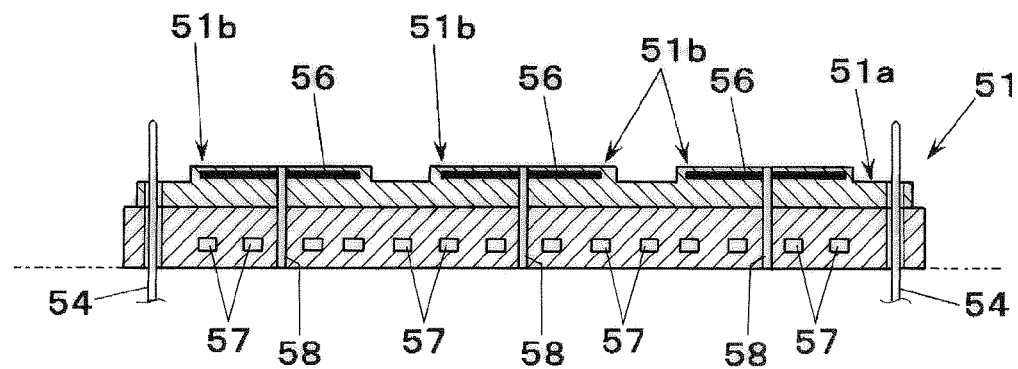
FIG. 11B is a side cross-sectional view of the susceptor in the processing chamber provided in the plasma processing apparatus according to the first embodiment of the present invention.

Referring to FIGS. 11A and 11B, the susceptor 51 includes a tray set unit 51a, and a plurality of wafer support units 51b provided so as to protrude upward from the tray set unit 51a. The tray 7 (the wafer aw is housed in each housing hole 7a in this tray 7) which have been subjected to the center alignment (centering) with respect to the rotating table 41 and the positioning in the rotation direction of the tray 7 in the alignment chamber 4 and carried by the carrier arm 31 in the carrier chamber 3 is set on the tray set unit 51a. When the tray 7 after subjected to the centering and the positioning in the rotation direction is set on the tray set unit 51a, the wafer support unit 51b enter the housing hole 7a of the tray 7 from below and lift and support the wafer W.

Figure 12A:
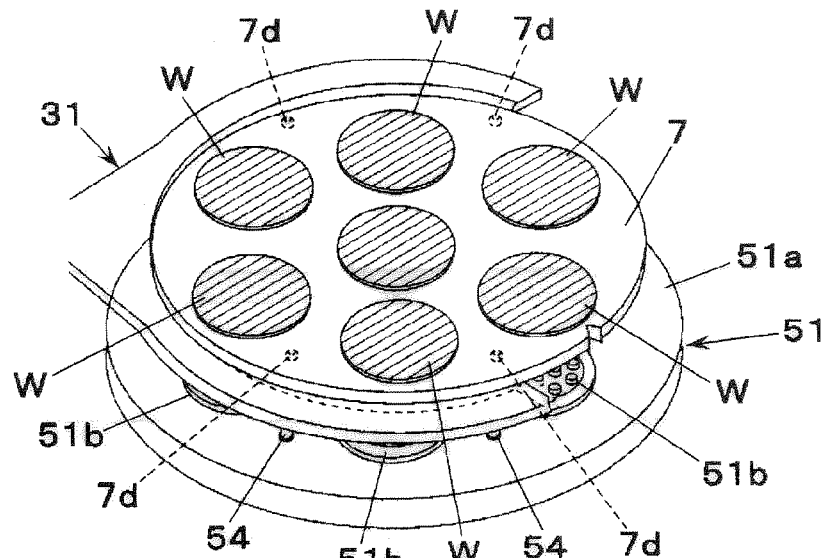
FIG. 12A is a view showing a procedure to set the tray on the susceptor in the processing chamber provided in the plasma processing apparatus according to the first embodiment of the present invention.
Figure 12B:
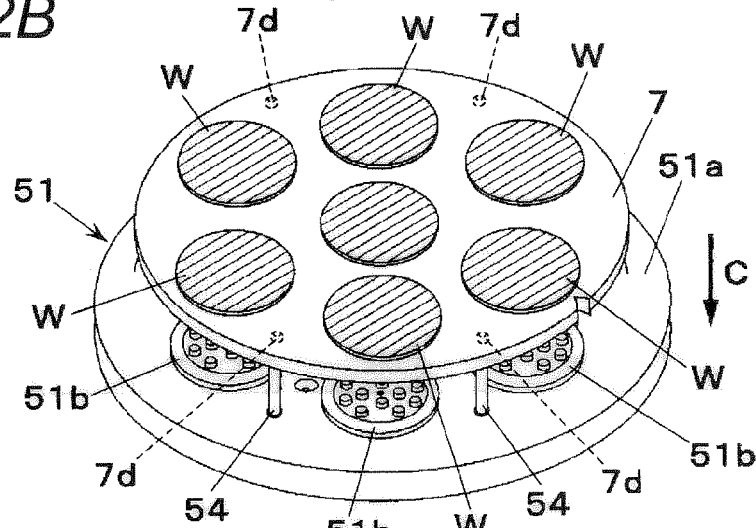
FIG. 12B is a view showing a procedure to set the tray on the susceptor in the processing chamber provided in the plasma processing apparatus according to the first embodiment of the present invention.
Figure 12C:
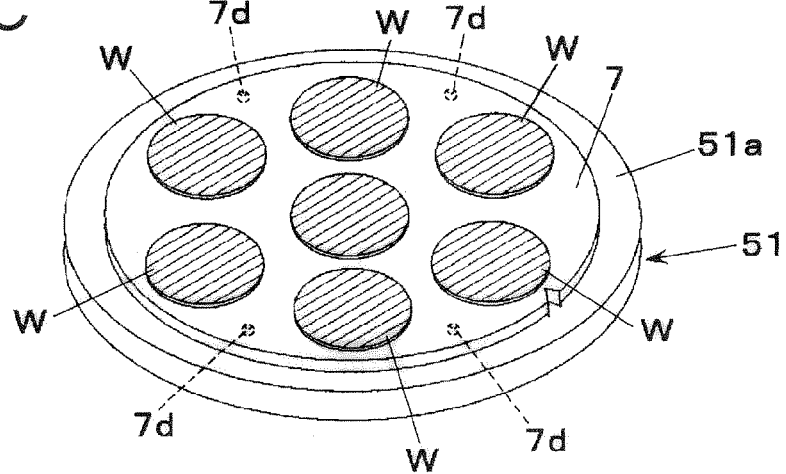
FIG. 12C is a view showing a procedure to set the tray on the susceptor in the processing chamber provided in the plasma processing apparatus according to the first embodiment of the present invention.
Figure 13A:
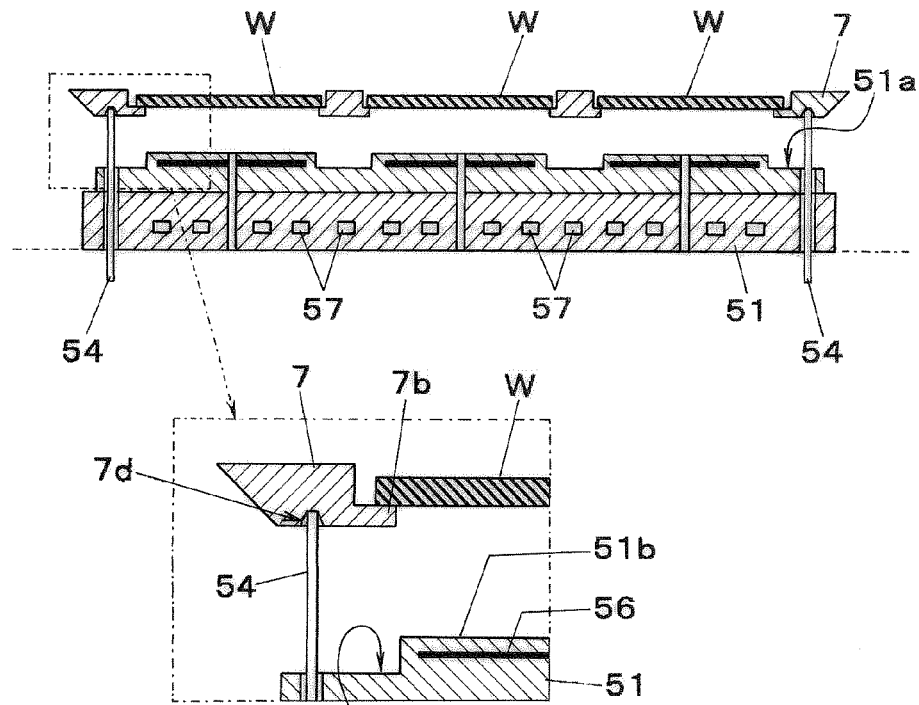
FIG. 13A is a view showing a procedure to set the tray on the susceptor in the processing chamber provided in the plasma processing apparatus according to the first embodiment of the present invention.
Figure 13B:
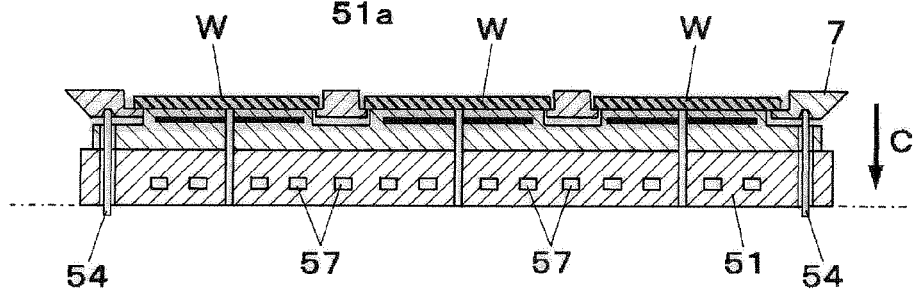
FIG. 13B is a view showing a procedure to set the tray on the susceptor in the processing chamber provided in the plasma processing apparatus according to the first embodiment of the present invention.
Figure 13C:
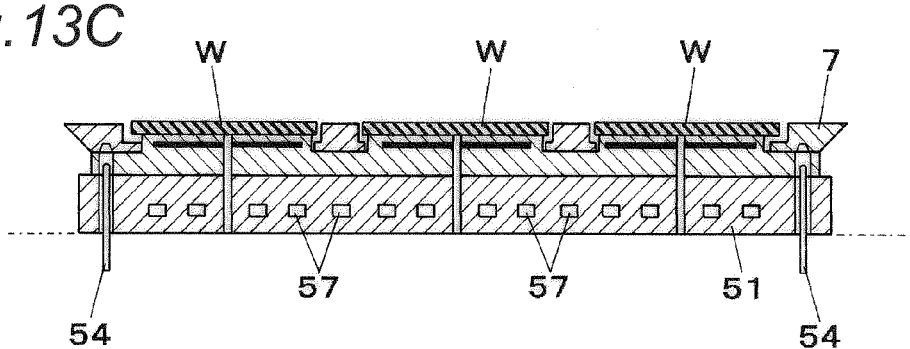
FIG. 13C is a view showing a procedure to set the tray on the susceptor in the processing chamber provided in the plasma processing apparatus according to the first embodiment of the present invention.

Referring to FIG. 11A, four up-and-down pins 54 are provided in the susceptor 51 and move up and down in synchronization with an action of an up-and-down pin driving mechanism 53 (FIG. 6) controlled by the control device 6. Four up-and-down pin insertion holes 7b (FIGS. 5A and 5B) provided in a lower face of the tray 7 may fit in upper ends of the four up-and-down pins 54 from above. Under the condition that the four up-and-down pin insertion holes 7d of the tray 7 fitted in the four up-and-down pins 54 (FIGS. 12A and 13A), the four up-and-down pins 54 are lowered toward the susceptor 51 (as shown by an arrow C in FIGS. 12B and 13B). After the lowering, the tray 7 is set on the tray set unit 51a and the wafer W housed in the housing hole 7a of the tray 7 is supported so as to be separated from the tray 7 (FIGS. 12C and 13C) due to the wafer support unit 51b which has entered the housing hole 7a from below.

Referring to FIG. 6, the plasma processing unit 52 includes a gas supply source 52a, a vacuum exhaust equipment 52b, a first high-frequency voltage application equipment 52c, a DC voltage application equipment 52d, a refrigerant circulation equipment 52e, a cold gas supply equipment 52f, and a second high-frequency voltage application equipment 52g (FIG. 6) which are all controlled by the control device 6. The gas supply source 52a supplies a gas for generating plasma to the processing chamber 5. The vacuum exhaust equipment 52b exhausts the gas in the processing chamber 5 by vacuum exhausting. The first high-frequency voltage application equipment 52c applies a high-frequency voltage to a dielectric coil 55 (FIG. 3) provided above the processing chamber 5. The DC voltage application equipment 52d applies a DC voltage to an electrostatic adsorbing electrode 56 (FIG. 11B) provided in the wafer support unit 51b to electrostatically adsorb the wafer W set on the wafer support unit 51b to the wafer support unit 51b. The refrigerant circulation equipment 52e circulates a refrigerant whose temperature has been adjusted, in a refrigerant flow path 57 (FIG. 11B) provided in the susceptor 51. The cold gas supply equipment 52f supplies a cold gas (such as helium gas) to a cold gas supply pipe line 58 (FIGS. 11B, 13A, 13B, and 13C) provided in the susceptor 51 and is open into an upper face of the wafer support unit 51b to cool the wafer W. The second high-frequency voltage application equipment 52g generates bias to draw the plasma generated in the processing chamber 5 toward the wafer W.

Figure 14:
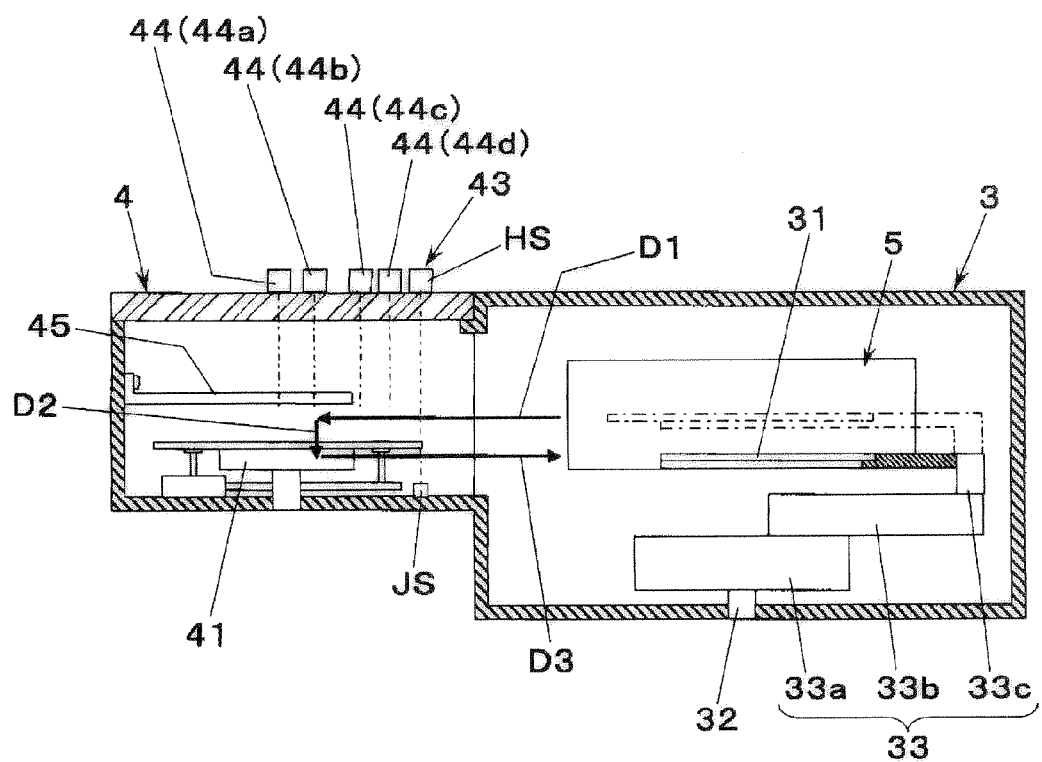
FIG. 14 is a side cross-sectional view of the plasma processing apparatus according to the first embodiment of the present invention.

Next, a description will be given of a procedure to collectively execute the plasma processing on the plurality of wafers W through a batch process in the plasma processing apparatus 1. The control device 6 first controls the carrier arm 31 so that the carrier arm 31 is transferred and holds one of the plurality of trays 7 (the wafer W is housed in each housing hole 7a of the tray 7) stored in the stock unit 2. Then, the control device 6 actuates the carrier arm 31 so that the carrier arm 31 carries the tray 7 to the alignment chamber 4 (as shown by an arrow D1 in FIG. 14). The control device 6 further lowers the carrier arm 31 above the rotating table 4 to set the tray 7 on the rotating table 41 (shown by an arrow D2 in FIG. 14). The control device 6 returns the carrier arm 31 to the carrier chamber 31 after the tray 7 has been set on the rotating table 41 (shown by an arrow D3 in FIG. 14).

After setting the tray 7 on the rotating table 41 in the alignment chamber 4, the control device 6 controls the action of the centering mechanism drive unit 42d to actuate the centering mechanism 42, and the tray 7 is centered in the way described above (step ST1 shown in FIG. 15). Then, after the centering of the tray 7, the rotating table 41 is actuated to rotate the tray 7 360 degrees or more to detect the notch 7c provided in the tray 7 with the notch detecting sensor 43. Then, after the notch 7c has been detected, the rotation (rotation of the rotating table 41) is stopped to figure out the original position of the rotating direction of the tray 7 (step ST2 shown in FIG. 15).

Figure 15:
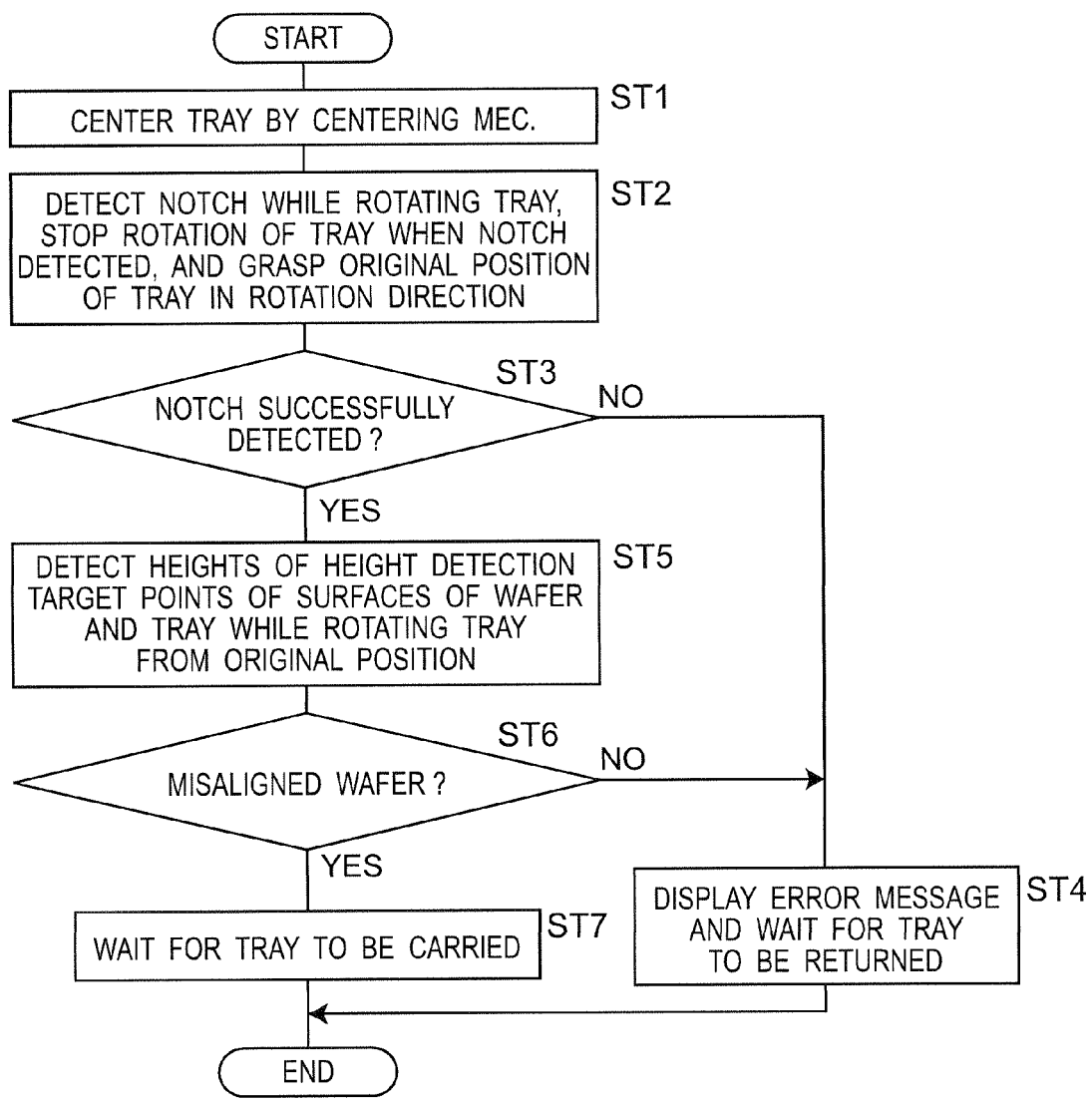
FIG. 15 is a flowchart showing an operation procedure in the alignment chamber of the plasma processing apparatus according to the first embodiment of the present invention.

After step ST2, the control device 6 determines whether or not the notch 7c has been successfully detected (step ST3 shown in FIG. 15). Then, when it is determined that the notch 7c has not been successfully detected in step ST2, an error message is displayed on a display unit (alarm generation unit) 61 (shown in FIG. 6) such as a display provided in the plasma processing apparatus 1, and a standby state to return the tray 7 to the stock unit 2 is started (step ST4 shown in FIG. 15). Note that the number of times the rotating table 41 is rotated to detect the notch 7c in step ST2 is limited to the predetermined number of times (such as 3 times), and in the case where the notch 7c cannot be detected after the rotating table 41 has been rotated the predetermined number of times, the control device 6 determines that the notch 7c cannot be detected and the process moves from step ST3 to step ST4.

Meanwhile, when the housing state determination unit 6b of the control device 6 determines that the notch 7c can be successfully detected in step ST3, the four height detecting sensors 44A to 44D detect the heights of the height detection target points of the surface of the wafer W housed in each of the housing holes 7a of the tray 7, and the surface of the tray 7 set on the rotating table 41 in the way described above while rotating the tray 7 from the original position (step ST5 shown in FIG. 15).

After the above detection in step ST5, the housing state determination unit 6b of the control device 6 detects whether or not there is the wafer W which is misaligned with respect to the corresponding hole 7a among the wafers W housed in the housing holes 7a in the tray 7 set on the rotating table 41, based on the data of the heights of the height detection target points of the surfaces of the wafer W and the tray 7 detected by the four height detecting sensors 44A to 44D (step ST6 shown in FIG. 15).

As a result, when the housing state determination unit 6b of the control device 6 determines that there is the wafer W (at least one) which is misaligned with respect to the corresponding housing hole 7a, among the wafers W housed in the housing holes 7a in the tray 7, an error message (alarm) is displayed on the display unit 61 (step ST4 shown in FIG. 15). The error message to be displayed on the display unit 61 may be any one of a character, graphic, symbol, and lighting of a lamp as long as an operator can recognize it. Furthermore, in addition to the display unit 61 or instead of the display unit 61, a sound output unit may be provided to output an error message (alarm) with sound or voice.

In addition, when it is determined that there is the wafer W (at least one) which is misaligned with respect the housing hole 7a, a standby state to return the tray 7 to the stock unit 2 is started (step ST4 shown in FIG. 15). The standby state is completed after a condition to return the tray 7 to the stock unit 2 is satisfied. After the completion of the standby state, under the control of the control device 6, the carrier arm 31 of the carrying mechanism 30 holds the tray 7 on the rotating table 41 and returns the tray 7 from the alignment chamber 4 to the cassette 21 in the stock unit 2.

Meanwhile, the housing state determination unit 6b of the control device 6 determines that there is no wafer W which is misaligned with respect to the housing hole 7a, among the wafers W housed in the housing holes 7a in the tray in step ST6, a standby state to carry the tray 7 to the processing chamber 5 is started (step ST7 shown in FIG. 15). Thus, the processing in the alignment chamber 4 is completed.

Thus, according to the plasma processing apparatus 1 in the present first embodiment, it is determined whether or not the wafer housed in each of the housing holes 7a in the tray 7 is misaligned with respect the corresponding housing hole 7a, in the stage for the positioning of the tray 7 in the alignment chamber 4 before the plasma processing is executed on the wafer W in the processing chamber 5. As a result, when there is the wafer W which is misaligned with respect to the corresponding housing hole 7a, that tray 7 is not carried to the susceptor 51 in the processing chamber 5.

Figure 16A:
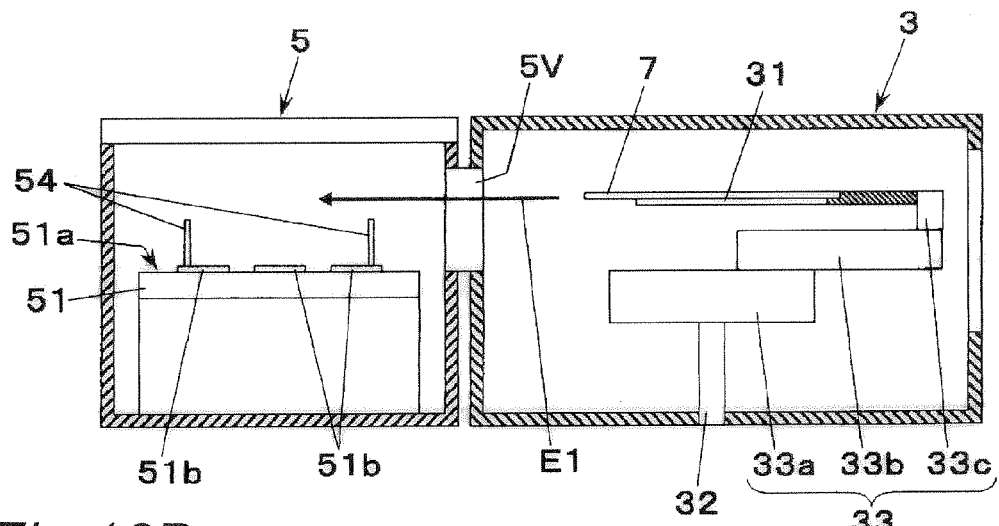
FIG. 16A is a side cross-sectional view of the plasma processing apparatus according to the first embodiment of the present invention.
Figure 16B:
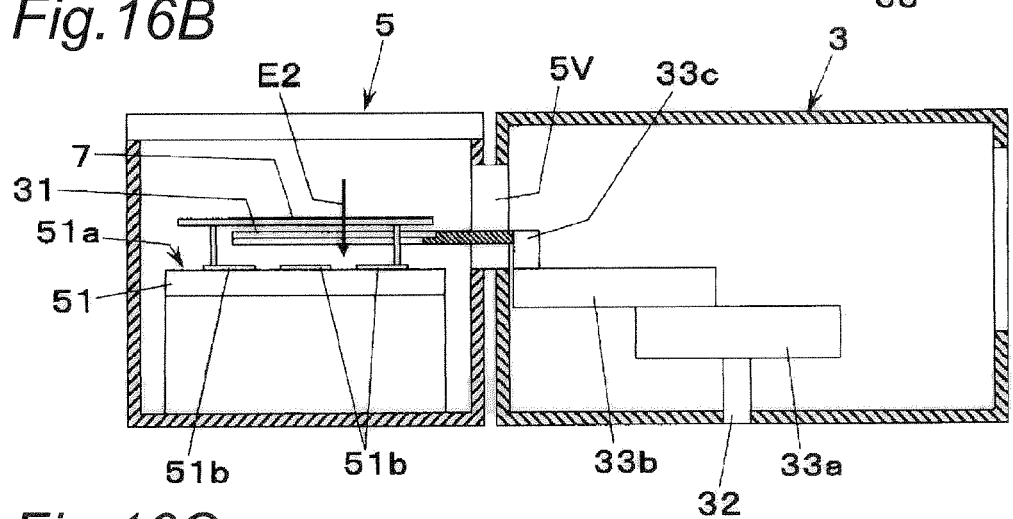
FIG. 16B is a side cross-sectional view of the plasma processing apparatus according to the first embodiment of the present invention.

When the standby state is started in step ST7 after the housing state determination unit 6b has determined that there is no wafer W which is misaligned with respect to the corresponding housing hole 7a, the carrier arm 31 holds the tray 7 on the rotating table 41, and sets the tray 7 on the susceptor 51 in the processing chamber 5 after passing through the carrier chamber 3 under the control of the control device 6. These actions are shown by an arrow E1 in FIG. 16A and an arrow E2 in FIG. 16B. At this time, since the tray 7 has been already subjected to the center alignment (centering) with respect to the rotating table 41 and the positioning in the rotation direction in the alignment chamber 4, the upper ends of the four up-and-down pins 54 provided in the susceptor 51 is inserted into the four up-and-down pin insertion holes 7d provided in the lower face of the tray 7, and the tray 7 is supported by the four up-and-down pins 54.

Figure 16C:
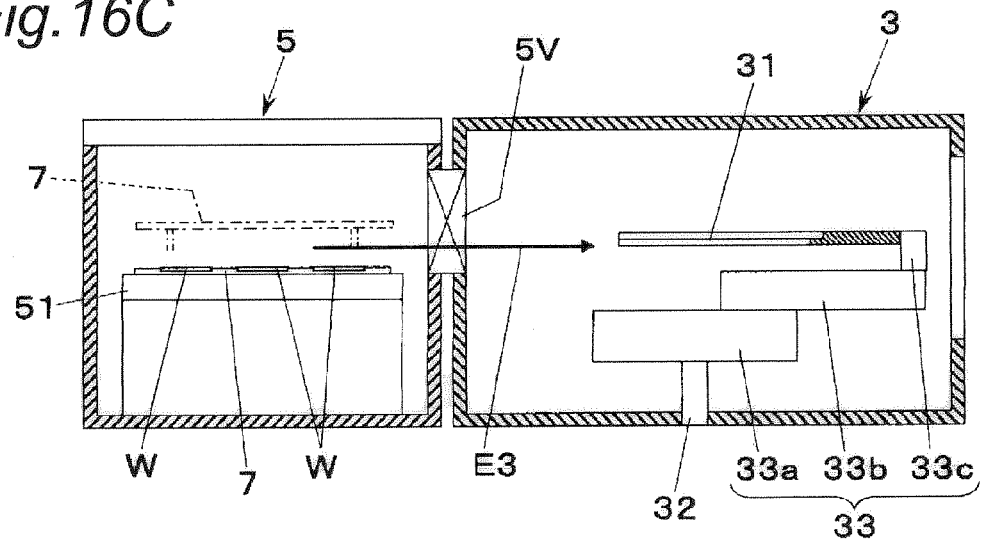
FIG. 16C is a side cross-sectional view of the plasma processing apparatus according to the first embodiment of the present invention.

After the tray 7 has been supported by the four up-and-down pins, the carrier arm 31 leaves the processing chamber 5 under the control of the control device 6, (as shown by an arrow E3 in FIG. 16C). Then, the gate valve 8 provided in the processing chamber 5 is closed and the processing chamber 5 is put into a hermetically-sealed state.

After the processing chamber 5 has been hermetically sealed, the control device 6 controls the action of the up-and-down pin driving mechanism 53 to lower the four up-and-down pins 54. The lowering allows the tray 7 to be set on the tray set unit 51a of the susceptor 51, and the wafers W housed in the housing holes 7a of the tray 7 are set (supported) on the wafer support units 51b of the susceptor 51 (FIG. 16C).

After setting the tray 7 and the wafers W on the susceptor 51, the control device 6 controls the action of the gas supply source 52a to supply the plasma generating gas into the processing chamber 5. Then, the control device 6 actuates the DC voltage application equipment 52d to apply an DC voltage to the electrostatic absorbing electrode 56 in the wafer support unit 51b. Thus, the wafers W on the wafer support units 51b are electrostatically absorbed to the electrostatic absorbing electrode 56.

After detecting the fact that a pressure of the plasma generating gas supplied into the processing chamber 5 has been adjusted to a predetermined pressure, the control device 6 controls the actuation of the first high-frequency voltage application equipment 52c to apply the high-frequency voltage to the dielectric coil 55. Thus, the plasma is generated in the processing chamber 5.

After the wafers W are held on the wafer support units 51b by the electrostatic absorption, the control device 6 actuates the cold gas supply equipment 52f to apply the cold gas from the cold gas supply pipe line 58 to the lower face of the wafer support unit 51b. In addition, the control device 6 controls the actuation of the second high-frequency voltage application equipment 52g so that the plasma in the processing chamber 5 is attracted to the wafers W on the wafer support units 51b. Thus, the wafer processing (etching) on the wafer W is started.

After the plasma processing on the wafer W has been started, and a predetermined time has passed, the control device 6 stops the application of the bias voltage from the second high-frequency voltage application equipment 52g to the electrostatic absorbing electrode 56, and stops the plasma generation in the processing chamber 5. Then, the control device 6 controls the action of the cold gas supply equipment 52f to stop the supply of the cold gas. After stopping the supply of the cold gas, the control device 6 stops the supply of the gas from the gas supply source 52a to the processing chamber 5, and stops the application of the high-frequency voltage from the first high-frequency voltage application equipment 52c to the dielectric coil 55 after the pressure of the cold gas on the lower face of the wafer W has been sufficiently reduced. Furthermore, the control device 6 stops the application of the DC voltage from the DC voltage application equipment 52d to the electrostatic absorbing electrode 56 and releases the electrostatic absorption of the wafer W. After releasing the electrostatic absorption of the wafer W, a neutralization processing is executed when needed to remove static electricity left of the wafer W or the tray 7, and the processing on the processing wafer is completed.

While the processing is executed in the processing chamber 5, the control device 6 always executes the exhausting action of the gas in the processing chamber 5 to the outside of the plasma processing apparatus 1 by the vacuum exhausting equipment 52b, and the circulating action of the refrigerant into the refrigerant flow path 57 by the refrigerant circulating equipment 52e. By the circulating action of the refrigerant into the refrigerant flow path 57 by the refrigerant circulating equipment 52e, the wafer W is cooled through the susceptor 51, so that high plasma processing efficiency can be maintained as well as cooling the wafer W due to the cold gas.

In addition, as described above, while the plasma processing is executed on the wafers W in the processing chamber 5, the carrier arm 31 takes the tray 7 having the wafers W to be subjected to the next plasma processing out of the stock unit 2 and carries it to the alignment chamber 4 under the control of the control device 6. In addition, the control device 6 sets the tray 7 on the rotating table 41. Thus, while the plasma processing is executed on the wafers W in the processing chamber 5, as for the tray 7 having the wafers W to be subjected to the next plasma processing, the center alignment (centering) with respect to the rotating table 41, the positioning in the rotation direction, and the detection of the presence of the wafer W can be executed.

After the plasma processing on the wafer W in the processing chamber 5 has been completed, the control device 6 actuates the up-and-down pin driving mechanism 53 so that the four up-and-down pins 54 are lifted, and the tray 7 is lifted and supported above the susceptor 51. Note that the four up-and-down pins 54 are inserted into the up-and-down pin insertion holes 7d provided on the lower face of the tray 7 from below during the lifting process.

Figure 16D:
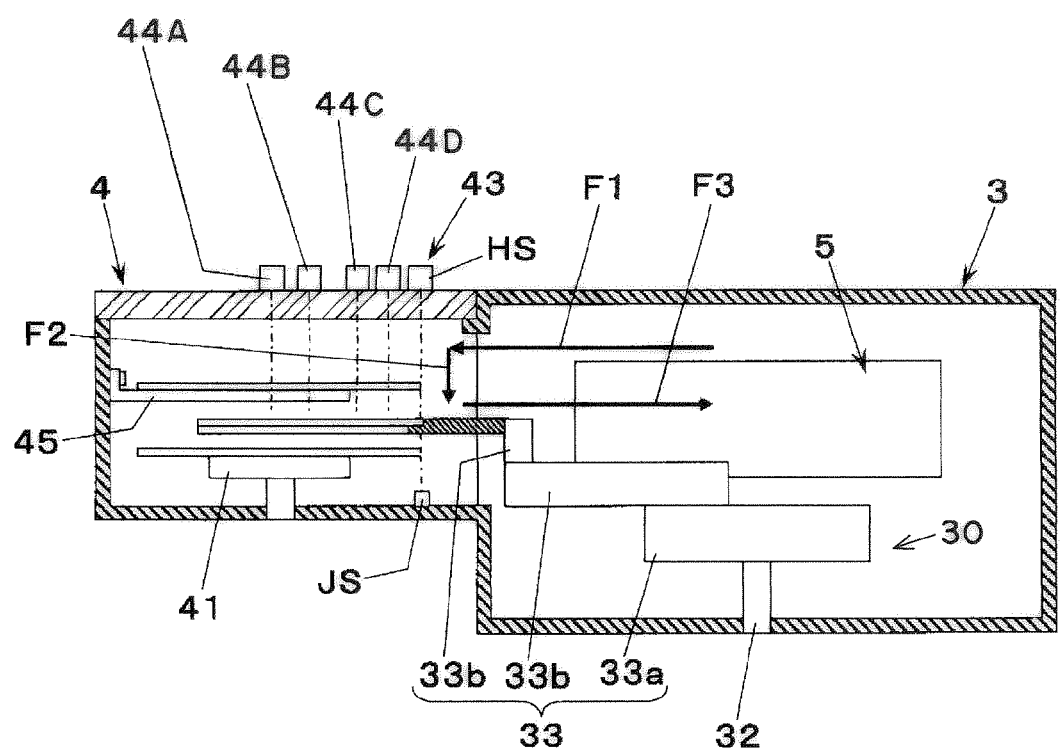
FIG. 16D is a side cross-sectional view of the plasma processing apparatus according to the first embodiment of the present invention.

After the tray 7 has been lifted and supported above the susceptor 51 by the lifting action of the up-and-down pins 54, the control device 6 opens the gate valve 8 and brings the carrier arm 31 into the processing chamber 5. In addition, under the control of the control device 6, the tray 7 lifted and supported by the up-and-down pins 54 are held by the carrier arm 31, and taken out of the processing chamber 5. Thus, the tray 5 is set on the temporary tray table 45 in the alignment chamber 4 (shown by arrows F1 and F2 in FIG. 16D). Then, the carrier arm 31 takes the tray 7 (tray 7 housing the wafers W to be subjected to the next plasma processing) on the rotating table 41 which has been already subjected to the center alignment (centering) with respect to the rotating table 41 and the positioning in the rotation direction, out of the alignment chamber 4 (shown by an arrow F3 in FIG. 16D), and carries the tray 7 to the processing chamber 5. After carrying the tray 7 housing the wafers W to be subjected to the next plasma processing to the processing chamber 5, under the control of the control device 6, the carrier arm 31 enters the alignment chamber 4, holds the tray 7 (tray 7 housing the wafers W which have been already subjected to the plasma processing), leaves the alignment chamber 4, and returns the tray 7 to the stock unit 2.

Thus, the tray 7 taken out of the processing chamber 5 is set once on the temporary tray table 45, cooled down, and returned to the stock unit 2. Thus, the wafers W (tray 7) which have been heated up to the high temperature in the plasma processing can be prevented from being returned to the stock unit 2 in the high-temperature state. In addition, while the tray 7 housing the high-temperature wafers W is set on the temporary tray table 45, the tray 7 housing the wafers W to be subjected to the next plasma processing is taken out of the alignment chamber 4 and carried to the processing chamber 5. Thus, a time required for the whole plasma processing can be shortened and the operation can be efficiently performed.

When the tray 7 which has been set on the temporary table 45 is returned to the stock unit 2, the batch processing for the wafers W housed in the tray 7 is completed.

As described above, the plasma processing apparatus 1 in the present first embodiment includes the alignment chamber 4 in which the positioning is executed on the tray 7 having the wafers W housed in the housing holes 7a, and the processing chamber 5 in which the plasma processing is performed on the wafers W housed in the housing holes 7a of the tray 7. In addition, the plasma processing apparatus 1 includes the rotating table 41 (table) on which the tray 7 housing the wafers W is set in the alignment chamber 4, and the positioning means (the notch detecting sensor 43, the alignment processing unit 6a of the control device 6, and centering mechanism 42) for positioning the tray 7 with respect to the tray 41 in the alignment chamber 4. In addition, the plasma processing apparatus 1 includes the susceptor 51 (support stand) to support the tray 7 in the processing chamber 5, and the plasma processing unit 52 serving as the plasma processing means for executing the plasma processing on the wafers W housed in the housing holes 7a of the tray 7 supported by the susceptor 51 in the processing chamber 5. Furthermore, the plasma processing apparatus 1 includes the carrier arm 31 serving as the carrying means for carrying the tray 7 which has been subjected to the positioning by the tray positioning means from the rotating table 41 in the alignment chamber 4 to the susceptor 51 in the processing chamber 5, and the four height detecting sensors 44A to 44D and the housing state determination unit 6b of the control device 6 serving as the misalignment detecting means for detecting whether or not the wafer W housed in each of the housing holes 7a of the tray 7 set on the rotating table 41 in the alignment chamber 4 is misaligned with respect to the corresponding housing hole 7a.

According to the plasma processing apparatus 1 in the first embodiment, it is determined whether or not the wafer W housed in each of the housing holes 7a in the tray 7 is misaligned with respect the corresponding housing hole 7a, in the stage for positioning the tray 7 in the alignment chamber 4 before the plasma processing is executed on the wafer W in the processing chamber 5. As a result, in the case where there is the wafer W which is misaligned with respect to the corresponding housing hole 7a, that tray 7 is not carried to the susceptor 51 in the processing chamber 5. Therefore, it becomes possible to prevent the phenomenon that the wafer W which is not sufficiently cooled down is exposed to the high-temperature plasma, caused by the fact that the cold gas is not sufficiently applied to the lower surface of the wafer W due to the misalignment of the wafer W with respect to the housing hole 7a. Thus, it becomes possible to prevent the phenomenon that the resist is burned in the wafer W because the wafer is not sufficiently cooled down due to the misalignment with respect to the housing hole 7a.

In addition, by arranging the detecting means for detecting the misalignment of the wafer W in the alignment chamber 4, the plasma processing apparatus 1 can be miniaturized, and the misalignment can be detected while the positioning of the tray is performed in the alignment chamber 4.

In addition, according to the plasma processing apparatus 1 in the present first embodiment, a housing state detecting unit includes the four height detecting sensors 44A to 44D serving as the height detecting unit to detect the heights of the plurality of positions on the surface of the wafer W housed in each of the housing holes 7a in the tray 7 set on the rotating table 41, and the housing state determination unit 6a of the control device 6 to determine whether or not the wafer W housed in each of the housing holes 7a in the tray 7 is misaligned with respect to the corresponding housing hole 7a, based on the heights of the plurality of positions on the surface of the wafer W detected by the four height detecting sensors 44A to 44D, so that the detection on whether or not the wafer W is misaligned with respect to the housing hole 7a of the tray 7 can be executed with the inexpensive configuration.

In addition, according to the plasma processing apparatus 1 in the present first embodiment, the housing state determination unit 6b detects whether or not the wafer W housed in each of the housing holes 7a of the tray 7 is misaligned with respect to the corresponding housing hole 7a while the tray 7 is rotated by the rotating table 41. Thus, the time required for detecting the misalignment of the wafer W can be shortened, and the time required for the processing operation in the plasma processing apparatus 1 can be shortened.

(Second Embodiment)

Figure 17:
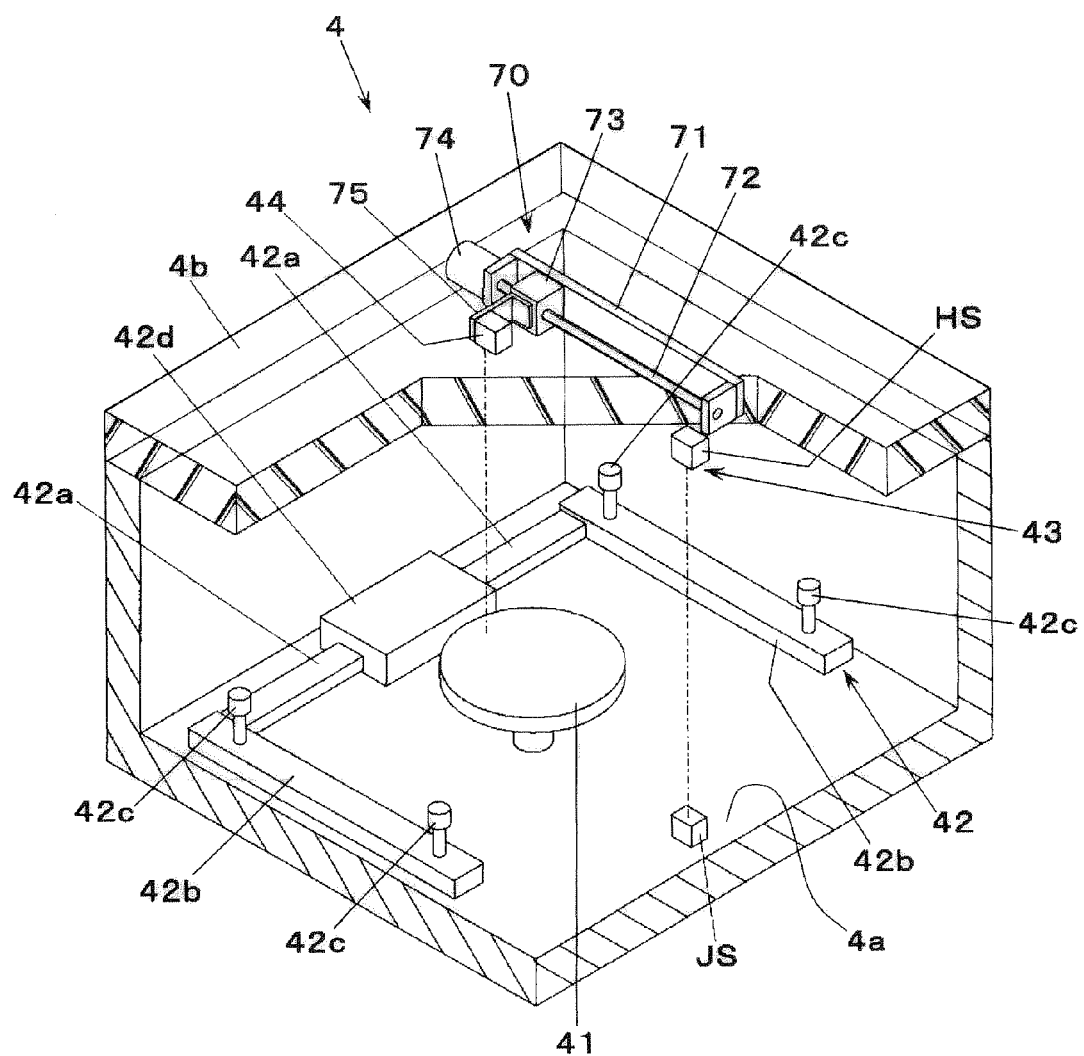
FIG. 17 is a cross-sectional perspective view of an alignment chamber provided in a plasma processing apparatus according to a second embodiment of the present invention.
Figure 18:
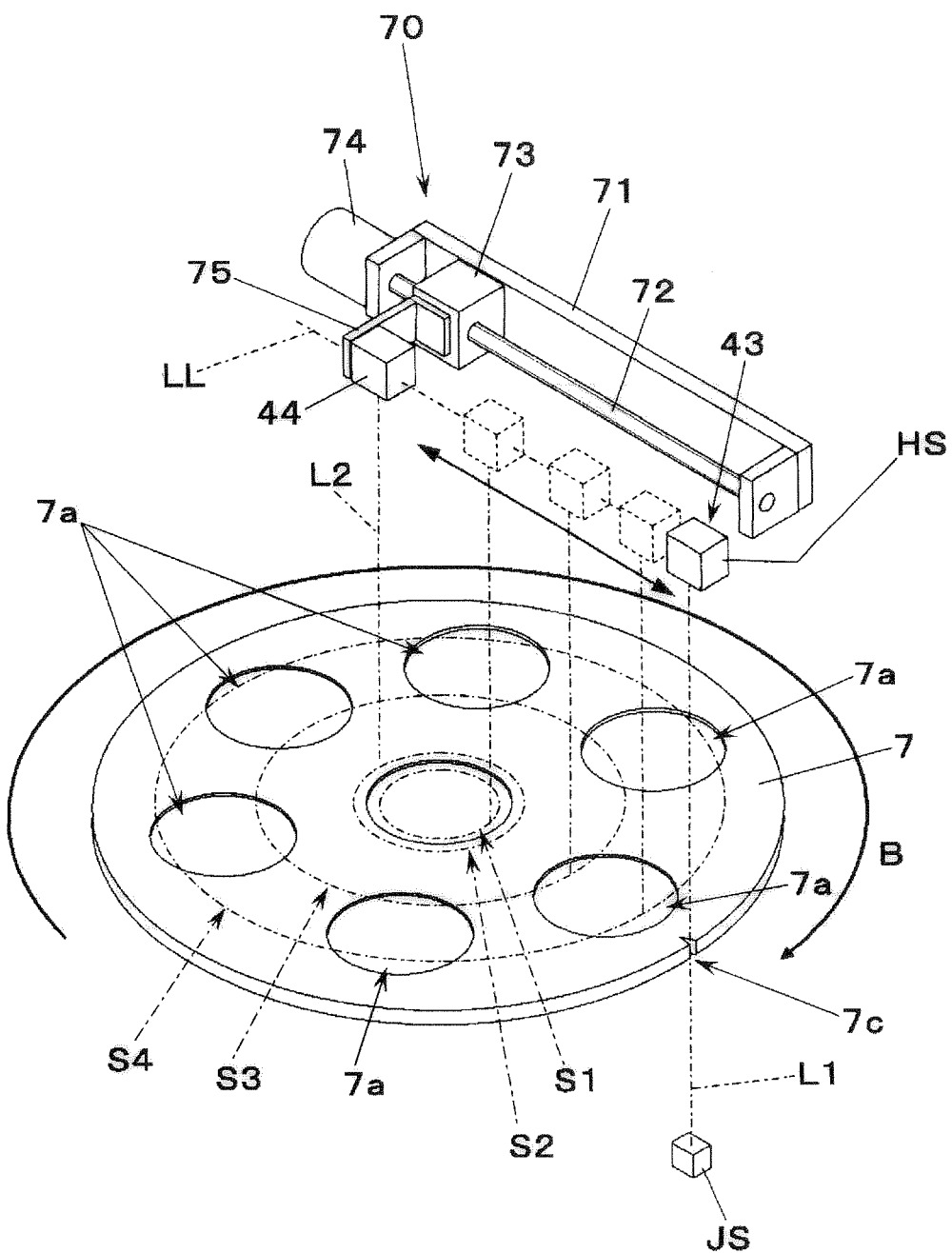
FIG. 18 is a view showing a positional relationship between a height detecting sensor and a tray in the alignment chamber provided in the plasma processing apparatus according to the second embodiment of the present invention.

A plasma processing apparatus according to an second embodiment has a configuration in which the one height detecting sensor 44 is mounted on a transferring mechanism 70 provided on the upper face of the ceiling unit 4b in the alignment chamber 4 as shown in FIGS. 17 and 18. The height detecting sensor 44 can be linearly transferred by the transferring mechanism 70 in the horizontal plane above the rotating table 41. The plasma processing apparatus in the present second embodiment differs from the plasma processing apparatus 1 in the first embodiment in that the one height detecting sensor 44 is provided, but other parts are the same as those of the plasma processing apparatus 1 in the first embodiment.

The transferring mechanism 70 includes a guide unit 71 provided on the ceiling unit 4b of the alignment chamber 4 so as to extend in the horizontal plane direction, a ball screw 72 provided so as to extend parallel to the guide unit 71, a move unit 73 screwed with the boll screw 72 and whose rotational transfer around the ball screw 72 is limited by the guide unit 71, and a ball screw drive motor 74 for rotationally driving the ball screw unit 71 axially. The height detecting sensor 44 is fixed to an extension unit 75 extending from the move unit 73. By the rotational driving of the ball screw drive motor 74 actuated and controlled by the housing state determination unit 6b of the control device 6, the move unit 73 is transferred along the guide unit 71, and the height detecting sensor 44 is transferred in the horizontal plane direction above the rotating table 41 (that is, above the tray 7).

According to the plasma processing apparatus in the second embodiment, the height detecting sensor 44 is provided so as to be transferred along the line LL in the first embodiment. The housing state determination unit 6b of the control device 6 transfers the height detecting sensor 44 by controlling the action of the ball screw drive motor 74 along the line LL while rotating the rotating table 41 (shown by an arrow B in FIG. 18). Thus, the same data of the height detection target points as those of the first embodiment can be obtained with the one height detecting sensor 44. Therefore, the plasma processing apparatus in the second embodiment can obtain the same effect as that of the plasma processing apparatus 1 in the embodiment 1.

(Third Embodiment)

Figure 19:
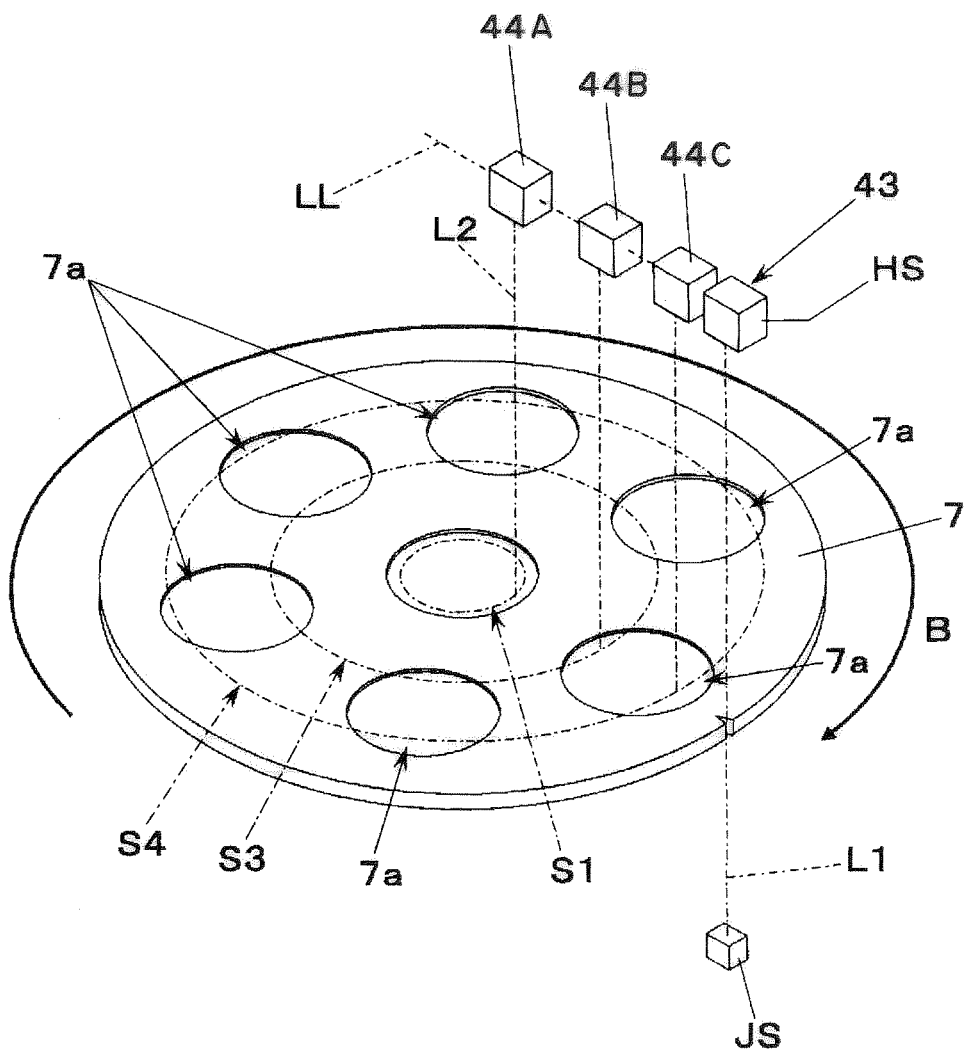
FIG. 19 is a view showing a positional relationship between a height detecting sensor and a tray in an alignment chamber provided in a plasma processing apparatus according to a third embodiment of the present invention.

A plasma processing apparatus according to a third embodiment shown in FIG. 19 differs from the plasma processing apparatuses in the first and second embodiments in that the three height detecting sensor are provided. More specifically, the three height detecting sensors, that is, the first height detecting sensor 44A, the second height detecting sensor 44B, and the third height detecting sensor 44C are provided on the upper face of the ceiling unit 4b of the alignment chamber 4 so as to be arranged along the line LL in the first embodiment.

Figure 20:
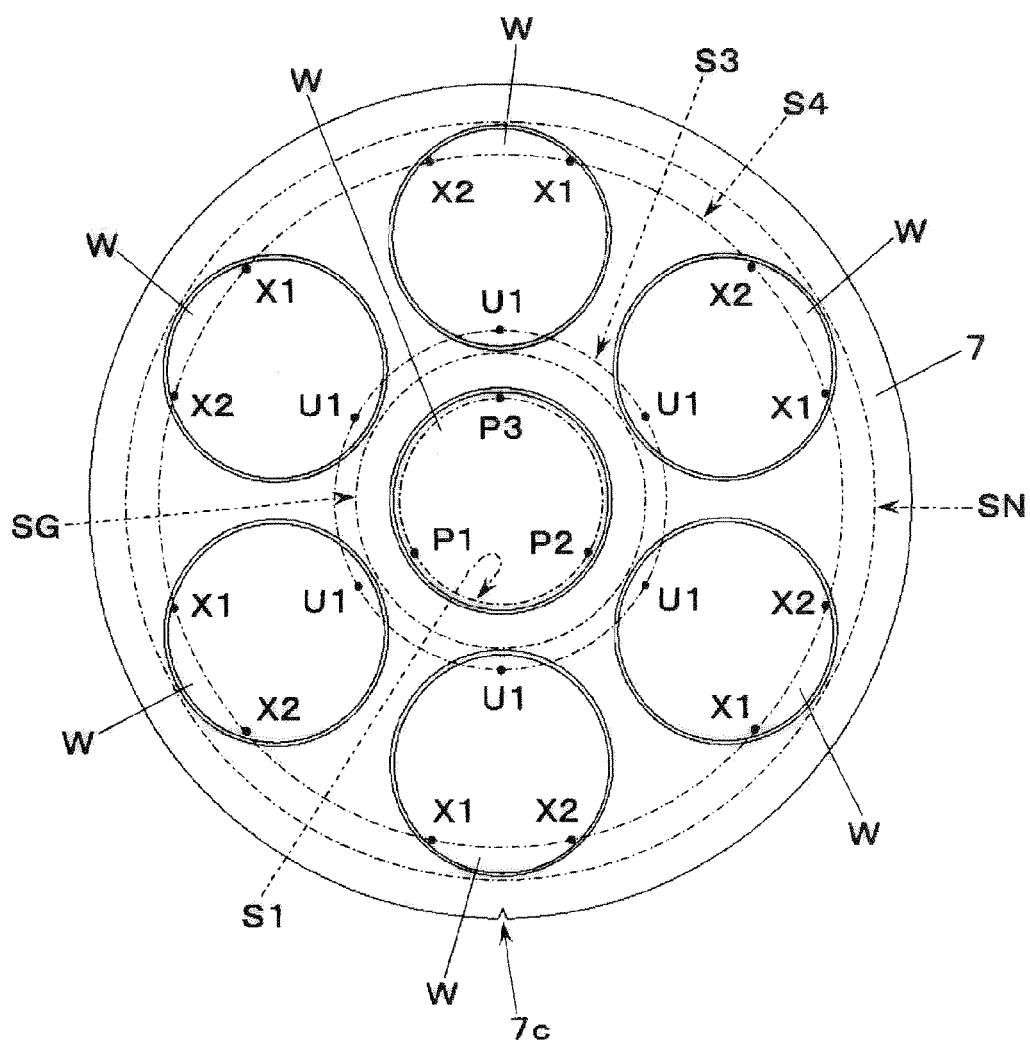
FIG. 20 is a view showing the tray provided in the plasma processing apparatus and height detection target points of the wafer housed in this tray according to the third embodiment of the present invention.

As shown in FIG. 19, the first height detecting sensor 44A irradiates one point on the virtual circle S1 (refer also to FIG. 20) in the first embodiment with the inspection light L2 and detects the heights of the three height detection target points P1, P2, and P3 (FIG. 20) near the outer edge of the surface of the wafer W positioned at one point on the virtual circle S1 (passing due to the rotation of the tray 7). In addition, the second height detecting sensor 44B irradiates one point on the virtual circle S3 in the first embodiment with the inspection light L2 and detects the height of the one height detection target point U1 (there are 6 height detection target points U1 in total as shown in FIG. 20) near the outer edge of the surface of the wafer W positioned at one point on the virtual circle S3 (passing due to the rotation of the tray 7). In addition, the third height detecting sensor 44C irradiates the one point on the virtual circle S4 in the first embodiment with the inspection light L2 and detects the heights of the two height detection target points X1 and X2 (there are 12 height detection target points X1 and X2 in total as shown in FIG. 20) near the outer edge of the surface of the wafer W positioned at one point on the virtual circle S4 (passing due to the rotation of the tray 7).

The housing state determination unit 6b of the control device 6 determines whether or not the wafer W housed in each of the housing holes 7a of the tray 7 is misaligned (inclined) with respect to the corresponding housing holes 7a, among the wavers W housed in the housing holes 7a of the tray 7, based on the heights of the three height detection target points (P1, P2, and P3, or U1, X1, and X2) on the wafer W.

More specifically, the housing state determination unit 6b determines that the wafer W is not misaligned with respect to the corresponding housing hole 7a when a variation in heights of the three height detection target points (P1, P2, and P3, or U1, X1, and X1) on the wafer W falls within a predetermined range, that is, when the heights of the three height detection target points are roughly the same. Meanwhile, the housing state determination unit 6b determines that the wafer W is misaligned with respect to the corresponding housing hole 7a when the variation in heights of the three height detection target points (P1, P2, and P3, or U1, X1, and X1) on the wafer W does not fall within the predetermined range. As for the six housing holes 7a on the side of the outer periphery of the tray 7, similar to the first embodiment, it may be determined whether or not the wafer W is misaligned, based on the difference between the height of the height detection target point on the wafer and the height of the height detection target point on the corresponding tray 7.

That is, the plurality of (three in this example) height detecting sensors 44A to 44C provided in the plasma processing apparatus in the third embodiment function as the height detecting unit for detecting the heights of the plurality of positions of the wafer W housed in each of the housing holes 7*a* in the tray 7 set on the rotating table 41, and the housing state determination unit 6*b* of the control device 6 functions as the determination unit for determining whether or not the wafer W housed in each of the housing holes 7*a* in the tray 7 is misaligned with respect to the corresponding housing hole 7*a*, based on the heights of the plurality of positions of the surface of the wafer W detected by the height detecting means (three height detecting sensors 44A to 44C). Therefore, the plasma processing apparatus in the third embodiment can obtain the same effects as those of the plasma processing apparatuses in the first and second embodiments.

(Fourth Embodiment)

Figure 21:
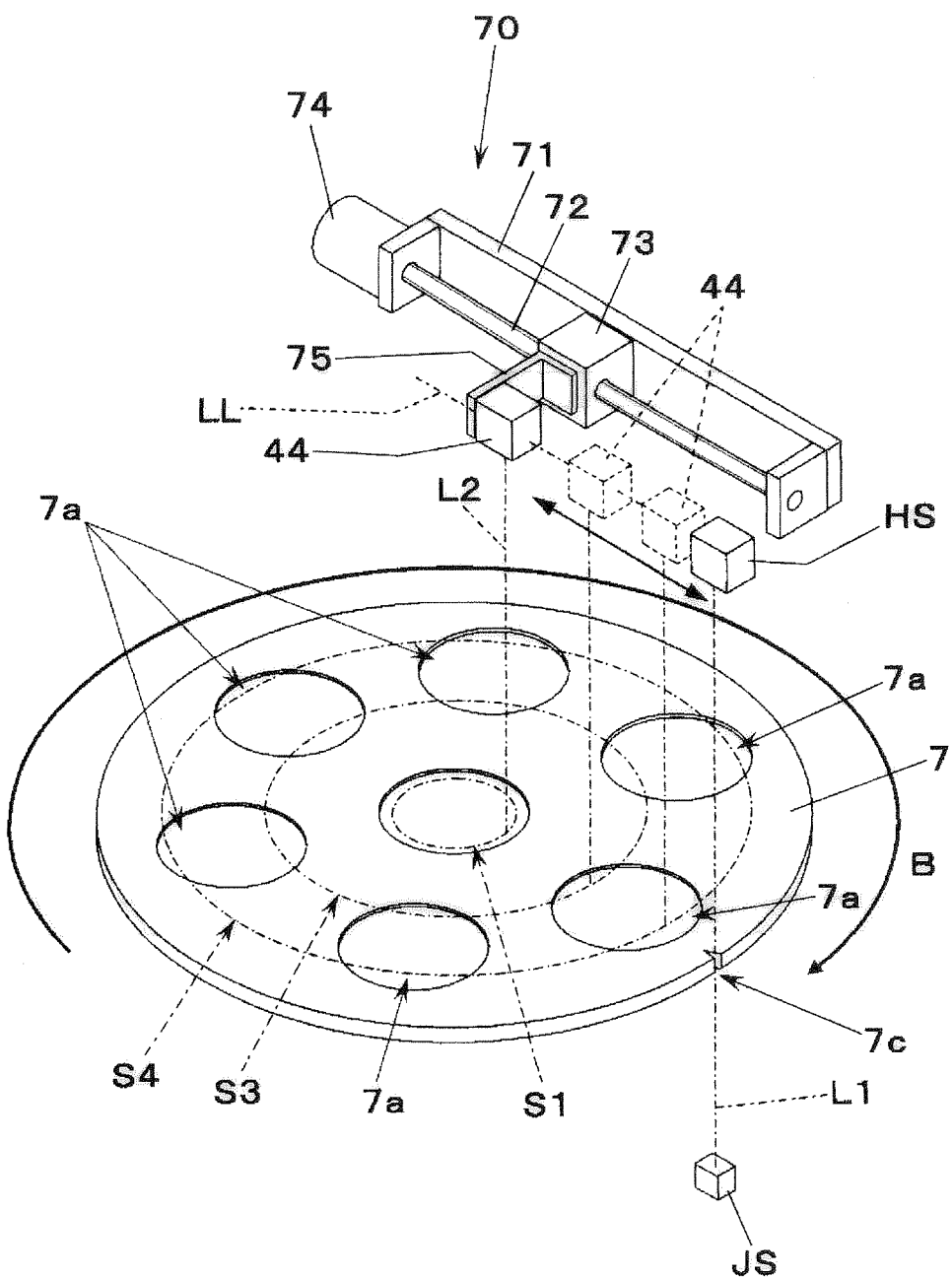
FIG. 21 is a view showing a positional relationship between a height detecting sensor and a tray in an alignment chamber provided in a plasma processing apparatus according to a fourth embodiment of the present invention.

According to a plasma processing apparatus in a fourth embodiment, as shown in FIG. 21, the one height detecting sensor 44 is transferred in the horizontal plane direction by the transferring mechanism 70 as described in the second embodiment, and detects the heights of the height detection target points on the surfaces of the seven wafers W which are detected by the three height detecting sensors 44A to 44C as described in the third embodiment. Thus, the plasma processing apparatus in the present fourth embodiment can obtain the same effects of the plasma processing apparatuses in the first to third embodiments.

(Fifth Embodiment)

Figure 22:
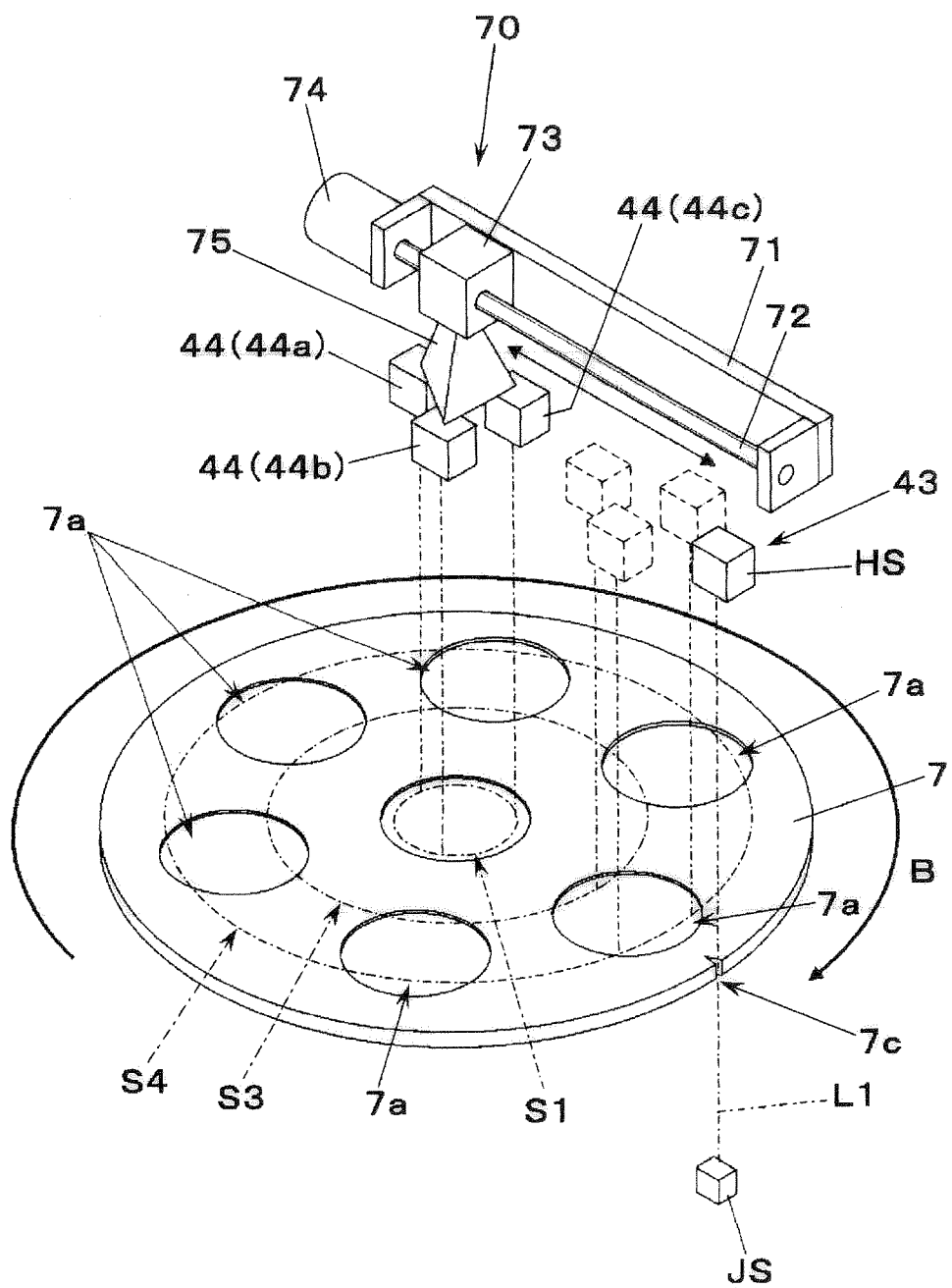
FIG. 22 is a view showing a positional relationship between a height detecting sensor and a tray in an alignment chamber provided in a plasma processing apparatus according to a fifth embodiment of the present invention.

According to a plasma processing apparatus in a fifth embodiment, as shown in FIG. 22, the three height detecting sensors can be transferred by the transferring mechanism 70 as described in the second embodiment in the horizontal plane direction, that is, the first height detecting sensor 44A, the second height detecting sensor 44B, and the third height detecting sensor 44C detect the heights of the height detection target points of the wafer W measured in the third or fourth embodiment, with respect to each wafer W at the same time. The housing state determination unit 6*b* of the control device 6 transfers the three height detecting sensors 44A to 44C together in the horizontal plane direction by the transferring mechanism 70, and rotates the tray 7 by the rotating table 41 (shown by an arrow B in FIG. 22), so that it can detect the heights of the three height detection target points on the surface of the wafer W housed in each of the seven housing holes 7*a* of the tray 7. Thus, the plasma processing apparatus in the fifth embodiment can obtain the same effects as those of the plasma processing apparatuses in the embodiments 1 to 4.

(Sixth Embodiment)

Figure 23:
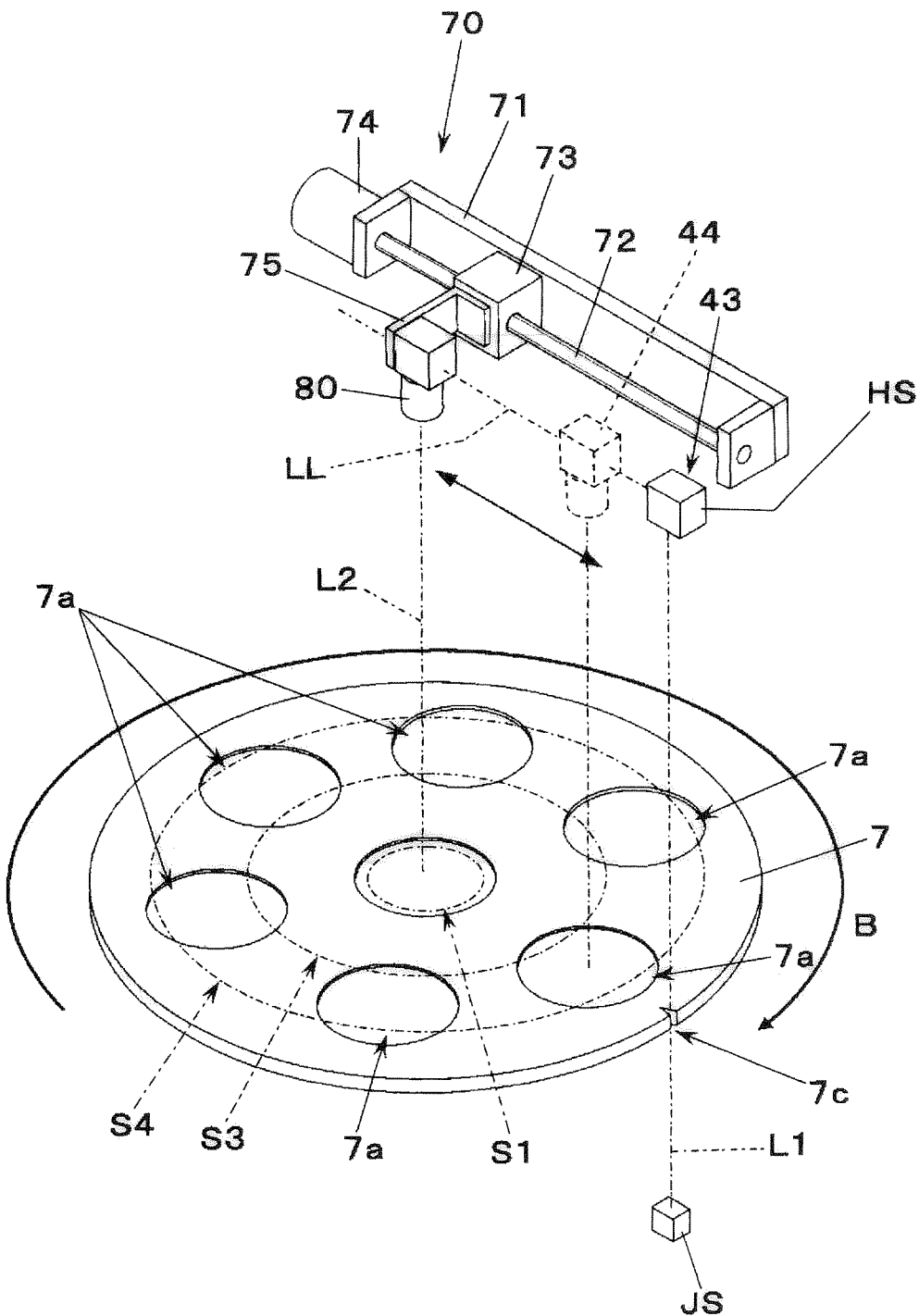
FIG. 23 is a view showing a positional relationship between a camera and a tray in an alignment chamber provided in a plasma processing apparatus according to an sixth embodiment of the present invention.

As shown in FIG. 23, a plasma processing apparatus in a sixth embodiment differs from the plasma processing apparatuses in the above-described first to fifth embodiments in that the misalignment detecting means for detecting whether or not the wafer W housed in each of the housing holes 7*a* in the tray 7 set on the rotating table 41 is misaligned with respect to the corresponding housing hole 7*a* is not the height detecting sensor but a camera 80 serving as an imaging means, and the camera 80 can be transferred in the horizontal plane direction by the transferring mechanism 70 as described in the second embodiment.

According to the plasma processing apparatus in the sixth embodiment, the camera 80 is provided so as to be transferred along the line LL, and under the control of the housing state determination unit 6*b* of the control device 6, the ball screw drive motor 74 is actuated and the camera 80 is transferred along the line LL and the camera 80 takes images while the rotating table 41 is rotated (shown by an arrow B in FIG. 23), so that image data of the wafer W in each of the seven housing holes 7*a* can be obtained with the one camera 80. Thus, the housing state determination unit 6*b* of the control device 6 can detect whether or not the wafer W housed in each of the housing holes 7*a* of the tray 7 is misaligned with respect to the corresponding housing hole 7*a*, based on the image of the wafer W obtained by the camera 80. Thus, the plasma processing apparatus in the sixth embodiment can obtain the same effects as those of the plasma processing apparatuses in the first to fifth embodiments.

In addition, according to the plasma processing apparatus in the sixth embodiment, the misalignment detecting means includes the camera 80 as the imaging means for taking the image of the wafer W housed in each of the housing holes 7*a* of the tray 7 set on the rotating table 41 from above, and the determining means (housing state determination unit 6*b* of the control device 6) for determining whether or not the wafer W housed in each of the housing holes 7*a* in the tray 7 is misaligned with respect to the corresponding housing hole 7*a*, based on the image taken by the camera 80, so that similar to the first to fifth embodiments, the detection on whether or not the wafer W is misaligned with respect to the housing hole 7*a* of the tray 7 can be executed with the inexpensive configuration.

(Seventh Embodiment)

Figure 24:
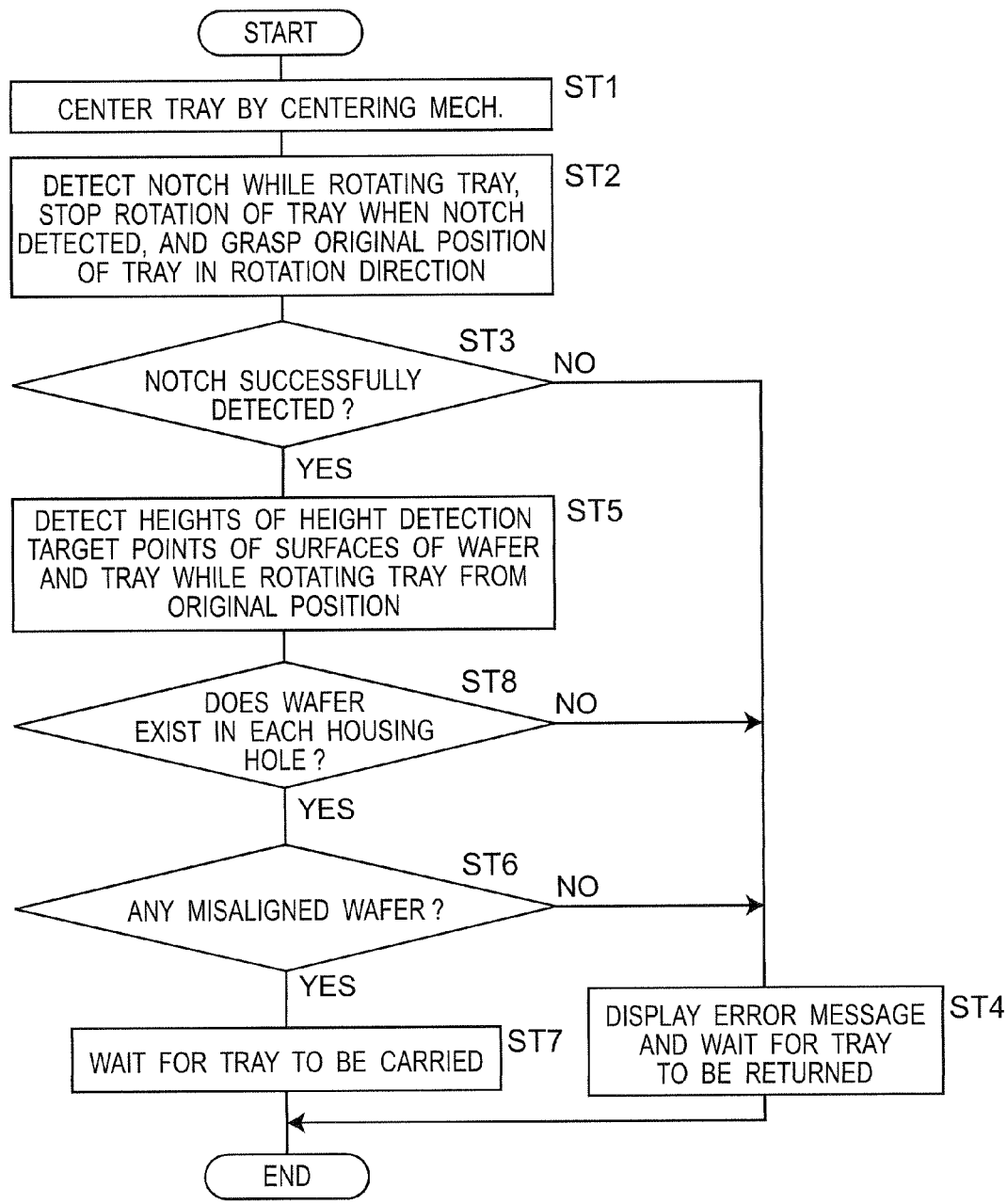
FIG. 24 is a flowchart showing an operation procedure in an alignment chamber of a plasma processing apparatus according to a seventh embodiment of the present invention.

A plasma processing apparatus in a seventh embodiment only differs from the others in that the housing state determination unit 6*b* executes a process in step ST8 between step ST5 and step S6 as shown in FIG. 24. In step ST8, it is determined whether or not each of the housing holes 7*a* in the tray 7 has the wafer. This determination is made based on the heights of the wafers W detected in the height detection target points P1, P2, P3, U1, U2, X1, and X2 (refer to FIG. 10) measured by the height detecting sensors 44A to 44B. For example, as for the wafer W arranged in the center of the tray 7, the heights of the three height detection target points P1, P2, and P3 can be used. In addition, as for the six wafers W on the outer periphery side of the tray 7, the heights of the three of the height detection target points U1, U2, X1, and X2 can be used. More specifically, in the case where the detected heights of the three height detection target points are all equal to or less than a predetermined reference height (corresponding to the height of the rotating table 41), it is determined that the wafer W does not exist in the housing hole 7*a*, and in the case other than that, it is determined that the wafer W exists in the housing hole 7*a*.

In step ST8, in the case where the housing state determination unit 6*b* determines that there is the housing hole 7*a* which does not have the wafer among the seven housing holes 7*a* in the tray 7, an error message is displayed on the display unit 61 (step ST4 in FIG. 24). In addition, in this case, a standby process to return the tray 7 to the stock unit 2 is started (step ST4 in FIG. 24). After the standby process, under the control of the control device 6, the carrier arm 31 of the carrying mechanism 30 holds the tray 7 on the rotating table 41, and returns it from the alignment chamber 4 to the cassette 21 of the stock unit 2.

Meanwhile, in the case where the housing state determination unit 6*b* determines that each housing hole 7*a* in the tray 7 has the wafer W in step ST8, a standby process to carry the tray 7 to the processing chamber 5 is started (step ST7 in FIG. 24), and the process in the alignment chamber 4 is completed.

In the case where the camera 80 (refer to FIG. 23) is used instead of the height detecting sensor as described in the sixth embodiment, the camera 80 takes the images of the housing holes 7*a* of the tray 7 and the wafers W housed therein from above. The housing state determination unit 6*b* can determine whether or not the wafer exists in each of the housing holes based on the image (step S8 in FIG. 24).

The embodiments of the present invention have been described, but the present invention is not limited to the above embodiments. For example, according to the above embodiment, the tray 7 has the one wafer W housed in the one housing hole 7a arranged in its center, and the six wafers in the six housing holes 7a arranged so as to be align at the same intervals on the virtual circle CL around the center position, but this is only one example, and the number of the wafers W in the tray 7 and the arrangement of the housing holes 7a are arbitrarily designed.

In addition, according to the above embodiment, the housing hole 7a of the tray 7 penetrates the tray 7 in the thickness direction, and when the tray 7 housing the wafers W is set on the tray set unit 51a of the susceptor 51, the wafer support units 51b of the susceptor 51 enter the housing holes 7a of the tray 7 from below to support the wafers W in the housing holes 7a of the tray 7. Therefore, the notch 7c of the tray is detected on the rotating table 41, so that the positioning in the rotation direction is performed. There is a case where the housing hole 7a of the tray 7 does not penetrate the tray 7 in the thickness direction (that is, the housing hole 7a has a bottom). In this case (the bottom of the housing hole 7a of the tray 7 is exposed to the plasma), as the wafer support unit 51b is not provided on the susceptor 51, and the tray 7 is only set on the tray set unit 51a of the susceptor 41, the tray 7 does not have the notch 7c. Therefore, in this case, the notch detecting sensor 43 is not needed, and the tray positioning unit does not have the rotational positioning unit.

In this case, the table on which the tray 7 is set in the alignment chamber 4 does not always have to be the above-described rotating table 41, and when the table is not the rotating table 41, the misalignment of the wafer W cannot be detected while the tray 7 is rotated. In this case, by transferring the three height detecting sensors 44 two-dimensionally in the plane parallel to the horizontal plane with the mechanism for transferring the three height detecting sensors 44A to 44C as described in the fifth embodiment in the horizontal plane, the heights of the three height detection target points on the surface of the wafer W can be easily detected.

In the above embodiment, the mechanism for aligning the tray 7 including the rotating table 41 is arranged in the independent alignment chamber 4. However, the mechanism for aligning the tray 7 including the rotating table 41 may be arranged in the carrier chamber 3. The present invention can be also applied to this configuration.

The specific configuration regarding the stock unit 2 is not limited to the above embodiment. For example, the plasma processing apparatus 1 in a variation shown in FIG. 25 includes a transfer unit 81 provided adjacent to the stock unit 2. The tray 7 having the wafers W before subjected to the processing is supplied from the transfer unit 81 to the stock unit 2, and the tray 7 is returned from the stock unit 2 to the transfer unit 81 after subjected to the processing. A transfer robot 83 is housed in a transfer chamber 82 in the transfer unit 81.

Figure 25:
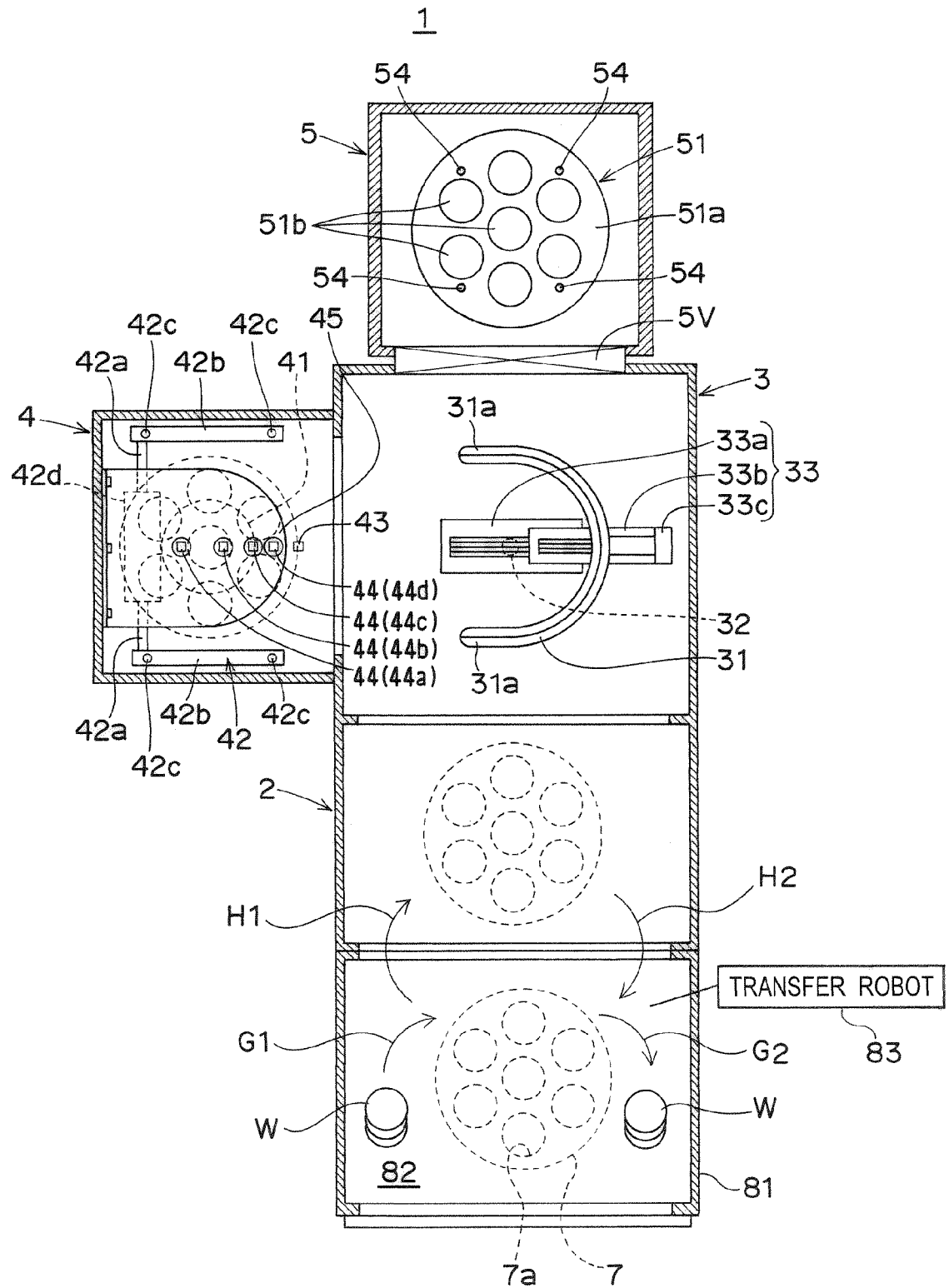
FIG. 25 is a side cross-sectional view of a plasma processing apparatus according to a variation of the present invention.

As conceptually shown by an arrow G1 in FIG. 25, the transfer robot 83 executes an action to house the wafers W in the housing holes of the tray 7 before the processing, that is, an action to transfer the wafers W into the tray 7. In addition, as conceptually shown by an arrow G2 in FIG. 25, the transfer robot 83 executes an action to take the wafer W which has been subjected to the dry etching out of the tray 7. Furthermore, the transfer robot 83 executes an action to transfer the tray 7 having the wafers W before the processing from the transfer unit 81 into the stock unit 2 (shown by an arrow H1 in FIG. 25), and an action to transfer the tray 7 having the wafers W after the processing from the stock unit 2 to the transfer unit 81 (shown by an arrow H2 in FIG. 25).

Industrial Applicability

A plasma processing apparatus capable of preventing a resist from being burned in a wafer can be provided.

The invention claimed is:

1. A plasma processing method comprising:
   carrying a tray formed with a plurality of housing holes in each of which a wafer is housed from a stock unit to an alignment unit, and setting the tray on a table;
   detecting a height at a wafer side target point of a surface of the wafer housed in each of the plurality of housing holes;
   determining whether or not the wafer is misaligned with respect to the corresponding housing hole, based on the height of the surface of the wafer at the detected wafer side target point;
   carrying the tray from the alignment unit to a processing unit and executing plasma processing when the wafer is housed in all of the housing holes of the tray on the table without being misaligned, and
   returning the tray from the alignment unit to the stock unit when the wafer is misaligned in any of the housing holes of the tray on the table.

2. The plasma processing method according to claim 1, further comprising detecting a height of a surface of the tray at a tray side target point opposed to the wafer side target point across a hole edge of the housing hole, wherein the determination on whether or not the wafer is misaligned with respect to the corresponding housing hole is based on a comparison between the height of the surface of the wafer at the wafer side target point and the height of the surface of the tray at the tray side target point.

3. The plasma processing method according to claim 1, further comprising determining whether or not the wafer exists in each of the housing holes, based on the height of the wafer side target point.

4. The plasma processing method according to claim 2, further comprising determining whether or not the wafer exists in each of the housing holes, based on the height of the wafer side target point.

* * * * *